(12) United States Patent
Hintermaier

(10) Patent No.: US 6,787,186 B1
(45) Date of Patent: Sep. 7, 2004

(54) METHOD OF CONTROLLED CHEMICAL VAPOR DEPOSITION OF A METAL OXIDE CERAMIC LAYER

(75) Inventor: Frank S. Hintermaier, Munich (DE)

(73) Assignees: Advanced Technology Materials, Inc., Danbury, CT (US); Infineon Technologies Corporation, Cupertino, CA (US)

(*) Notice: Subject to any disclaimer, the term of this patent is extended or adjusted under 35 U.S.C. 154(b) by 0 days.

(21) Appl. No.: 09/210,912

(22) Filed: Dec. 14, 1998

Related U.S. Application Data

(60) Provisional application No. 60/068,041, filed on Dec. 18, 1997, and provisional application No. 60/069,984, filed on Dec. 18, 1997.

(51) Int. Cl.⁷ .............................................. C23C 16/40
(52) U.S. Cl. ........................... 427/255.31; 427/126.3; 427/81
(58) Field of Search ....................... 427/255.31, 255.32, 427/126.3, 81

(56) References Cited

U.S. PATENT DOCUMENTS

| | | | | |
|---|---|---|---|---|
| 4,771,015 A | * | 9/1988 | Kanai et al. | 427/574 |
| 5,478,610 A | | 12/1995 | Desu et al. | |
| 5,527,567 A | | 6/1996 | Desu et al. | |
| 5,834,060 A | * | 11/1998 | Kawahara et al. | 427/255.3 |
| 5,876,503 A | * | 3/1999 | Roeder et al. | 427/255.23 |
| 5,902,639 A | * | 5/1999 | Glassman et al. | 427/248.1 |
| 5,918,123 A | * | 6/1999 | Yang | 438/253 |
| 5,972,430 A | * | 10/1999 | DiMeo, Jr. et al. | 427/255.32 |
| 6,010,744 A | * | 1/2000 | Buskirk et al. | 427/81 |

\* cited by examiner

*Primary Examiner*—Bret Chen
(74) *Attorney, Agent, or Firm*—Margaret Chappuis; Steven J. Hultquist; William F. Ryann

(57) ABSTRACT

A method of forming a metal oxide ceramic layer is provided, in which a gaseous flow of a vaporized solution of a precursor organo metal compound in a volatile organic solvent, e.g., plus an oxidizing gas, in the presence of a protonating additive substance and/or activating agent in gaseous state, is conducted into contact with a surface of a substrate. The operation is effected under vacuum pressure at a thermal decomposition temperature for converting the precursor compound to its corresponding metal oxide, e.g., having the same oxidation state as in the precursor compound. The additive substance is present in an amount sufficient for facilitating thermal decomposition of the precursor compound and for controlling the in situ oxidation state of the deposited metal and the amount of oxygen in the formed layer, e.g., while suppressing formation of volatile intermediates and of vacancies in the formed layer. The activating agent is present in an amount sufficient for producing in situ hydrogen-active compounds for enhancing conversion of the precursor compound to its said metal oxide as well as for controlling the in situ oxidation state of the deposited metal and the amount of oxygen in the formed layer, e.g., while suppressing formation of volatile intermediates and of vacancies in the formed layer.

64 Claims, 5 Drawing Sheets

# US 6,787,186 B1

METHOD OF CONTROLLED CHEMICAL VAPOR DEPOSITION OF A METAL OXIDE CERAMIC LAYER

CROSS REFERENCE TO RELATED APPLICATIONS

This patent application is related to Provisional Patent Applications Serial Nos. 60/068,041 (97-P-7946-US), entitled "ADDITIVES FOR STABILIZATION AND EFFICIENCY ENHANCEMENT FOR CVD PROCESSES OF BI OXIDE CERAMICS" and 60/069,984 (97P7944 US), entitled "SUPPLEMENT TO ADDITIVES FOR STABILIZATION AND EFFICIENCY ENHANCEMENT FOR CVD PROCESSES OF BI OXIDE CERAMICS. Both of these Provisionals were filed on Dec. 18, 1997 and have the same assignee and inventor as the present utility application.

FIELD OF THE INVENTION

This invention relates to a method of controlled chemical vapor deposition (CVD) of a metal oxide ceramic layer, and more particularly, to additives for stabilization and efficiency enhancement of CVD processes for forming bismuth oxide ceramics, such as in the form of thin layers or films on semiconductor substrates for use in fabricating microelectronic semiconductor devices, for example, ferroelectric capacitors, and the like.

BACKGROUND OF THE INVENTION

In fabricating microelectronic semiconductor devices and the like on a wafer substrate or chip, such as of silicon, to form an integrated circuit (IC), etc., various metal layers and insulation layers are deposited in selective sequence. To maximize integration of device components in the available substrate area to fit more components in the same area, increased IC miniaturization is utilized. Reduced pitch dimensions are needed for denser packing of components per present day very large scale integration (VLSI), e.g., at sub-micron (below 1 micron, i.e., 1,000 nanometer or 10,000 angstrom) dimensions.

Recently, ceramic phases with bismuth oxide (bismuth trioxide, $Bi_2O_3$) as a component have found widespread interest for application in semiconductor memories. In this regard, bismuth titanate ($Bi_4Ti_3O_{12}$), strontium bismuth tantalate (SBT, $SrBi_2Ta_2O_9$) and strontium bismuth titanate ($SrBi_4Ti_4O_{15}$) possess ferroelectric properties, which make these ceramic materials interesting for applications in non-volatile memories, e.g., FeRAMs (ferroelectric random access memories).

Ferroelectric materials, such as strontium bismuth tantalate (SBT, $SrBi_2Ta_2O_9$), also called an Aurivillius phase ferroelectric or mixed bismuth oxide layer structure, exhibit electric polarization in the absence of an externally applied electric field, such that the direction of polarization may be reversed by an electric field. Thus, ferroelectric capacitors are able to change their direction of polarization under an applied electric field, for instance, to switch between a "1" or a "0" value or state as might be required in a given IC system.

Very thin layers or films of ferroelectric ceramic materials are required for the above noted purposes, which materials, in addition, show a high conformality to the surface structure of the substrate. Moreover, it is necessary to produce these films rapidly and inexpensively. In practice, only a CVD process can meet all of these requirements.

Some examples of the fabrication of ferroelectric devices are shown in the following prior art.

U.S. Pat. No. 5,478,610 (Desu et al.), issued Dec. 26, 1995 (Desu Patent I), and its continuation in part U.S. Pat. No. 5,527,567, issued Jun. 18, 1996 (Desu Patent II), disclose a method of fabricating a layered structure oxide ferroelectric thin film by CVD involving chemical reaction between volatile organo metal compounds, such as alkyls, alkoxides, β-diketonates or metallocenes of the metal elements to be deposited, and gases such as oxygen, to produce a non-volatile solid that deposits on a substrate. For example, after such a film is deposited on a substrate having a thin surface layer of a metal, e.g., Pt, and then ferroannealed, a second thin layer of the metal is deposited, followed by a second ferroanneal, for forming a ferroelectric capacitor in which the first metal layer is the bottom electrode, the second metal layer is the top electrode and the deposited ceramic oxide film is the dielectric separating the two metal layers.

The Desu Patents I and II contemplate depositing a $SrBi_2(Ta_xNb_{2-x})O_9$ or $BaBi_2(Ta_xNb_{2-x})O_9$ film on a substrate by pulsed laser deposition (PLD). This involves using as preferred precursors $Ba(thd)_2$ (Ba-tetramethyl heptadione), $Sr(thd)_2$ (Sr-tetramethyl heptadione), $Bi(thd)_3$ (Bi-tetramethyl heptadione), $Ta(OC_2H_5)_5$ (Ta-ethoxide) and $Nb(OC_2H_5)_5$ (Nb-ethoxide) in stoichiometric ratios in a solvent that is an 8:2:1 mixture in moles of tetrahydrofuran ($C_4H_8O$), isopropanol ($C_4H_{10}O$) and tetraglyme ($C_{10}H_{22}O_5$), while the substrate is heated to a high temperature of at least 450° C. as claimed.

The Desu Patent II also contemplates depositing a strontium bismuth tantalate (SBT, $SrBi_2Ta_2O_9$) film on a substrate, by a liquid source delivery (LSD) method. This involves using $Sr(thd)_2$ (Sr-tetramethyl heptadione), $Bi(C_6H_5)_3$ (Bi-triphenyl, $BiPh_3$) and $Ta(OC_2H_5)_5$ (Ta-ethoxide) as precursors in such 8:2:1 molar ratio solvent mixture, at a high temperature of 450–800° C., in a two-step method, in which the film is first deposited at 450–600° C. for 5 minutes, and then at 600–700° C. for 30–120 minutes, compared to a one-step method wherein the film is deposited at 650° C.

It is desirable to have a one-step method of forming a metal oxide ceramic layer on a substrate by CVD that can be conducted, inexpensively, rapidly and efficiently under vacuum pressure, especially at a comparatively low deposition temperature, with facilitated thermal decomposition of the precursor organo metal compound to its metal oxide having the same oxidation state as in the precursor compound, and with control of the in situ oxidation state of the deposited metal and the amount of oxygen in the formed layer, while suppressing the formation of volatile intermediates and of vacancies in the formed layer.

SUMMARY OF THE INVENTION

The foregoing drawbacks are obviated in accordance with the present invention by providing a protonating additive substance and/or an activating agent for facilitating a one-step method of forming a metal oxide ceramic layer on a substrate by CVD that can be conducted inexpensively, rapidly and efficiently under vacuum pressure, especially at a comparatively low temperature.

According to a first aspect of the invention, a method of forming a metal oxide ceramic layer on a substrate by CVD is provided, comprising conducting a gaseous flow of a vaporized solution of a precursor organo metal compound in a volatile organic solvent, e.g., plus an oxidizing gas, in the presence of a protonating additive substance in gaseous state, into contact with a surface portion of the substrate under a vacuum pressure at a thermal decomposition temperature effective for converting the precursor compound to its corresponding metal oxide, e.g., having the same oxidation state as in the precursor compound.

The additive substance is present in an amount sufficient for facilitating the thermal decomposition of the precursor compound and for controlling the in situ oxidation state of the deposited metal and the amount of oxygen in the formed layer, e.g., while suppressing the formation of volatile intermediates and of vacancies in the formed layer.

The additive substance may be water, a volatile carboxylic acid compound, a volatile ketone, a volatile amine or ammonia. The carboxylic acid compound may be a volatile carboxylic acid, a volatile carboxylic acid anhydride, a volatile carboxylic acid ester, a volatile carboxylic acid nitrile, a volatile carboxylic acid isonitrile or a volatile carboxylic acid aldehyde. The additive substance is desirably present in an amount of about 0.01–200 mols per mol of the precursor compound.

According to an alternative feature of the invention, the conducting of the gaseous flow is effected in the additional presence of an activating agent in gaseous state in an amount sufficient for producing in situ hydrogen-active compounds for enhancing the converting of the corresponding precursor compound to its metal oxide. The activating agent may be carbon monoxide, hydrogen or a volatile lower aliphatic hydrocarbon having 1–4 carbon atoms or aromatic hydrocarbon, which volatile hydrocarbon is optionally substituted by a bromo, iodo or nitro (—$NO_2$) substituent, i.e., so as to provide a volatile brominated lower aliphatic or aromatic hydrocarbon, a volatile iodinated lower aliphatic or aromatic hydrocarbon or a volatile nitro group-containing lower aliphatic or aromatic hydrocarbon.

The decomposition temperature may be about 150–800° C., preferably about 150–350° C. or about 300–500° C., and particularly below 450° C., such as at least about 150° C. or 200° C. and at most about 445° C. or 440° C. or 430° C. or 425° C. or 400° C. The vacuum pressure may be about 0.01–100 Torr, preferably about 0.5–20 Torr.

The substrate may be made of silicon, a hydrocarbon based polymer, or the like. Where the substrate is provided of silicon containing a surface layer of a metal, e.g., Pt, the decomposition temperature is desirably about 300–500° C. and the vacuum pressure about 0.01–100 Torr, preferably about 0.5–20 Torr. Similarly, where the substrate is provided of a hydrocarbon based polymer containing a surface layer of a metal, the decomposition temperature is desirably about 150–350° C. and the vacuum pressure about 0.01–100 Torr, preferably about 0.5–20 Torr.

Typically, the oxidizing gas is an oxygen-containing inert carrier gas, e.g., comprising about 20–80%, preferably 40–80%, oxygen. Alternatively, the oxidizing gas may be a nitrogen oxide. The vaporized solution of the precursor compound and the additive substance are each advantageously provided in a separate inert carrier gas.

Specifically, the precursor compound may be an organo bismuth compound such as a triorgano bismuth compound, and typically comprises a mixture of an organo bismuth compound, an organo strontium compound and an organo tantalum compound such as a mixture of a triorgano bismuth compound, a diorgano strontium compound and a pentaorgano tantalum compound. In particular, the precursor compound comprises a mixture of bismuth tris-2,2,6,6-tetramethyl heptane-3,5-dionate, designated Bi(thd)$_3$, or bismuth triphenyl, designated BiPh$_3$, plus strontium bis-2,2,6,6-tetramethyl heptane-3,5-dionate, designated Sr(thd)$_2$, and tantalum 2,2,6,6-tetramethyl heptane-3,5-dionate tetra isopropoxide, designated Ta(OiPr)$_4$(thd), such as in a molar ratio of 0.25:0.15:0.40, respectively.

Alternatively, the strontium bis-2,2,6,6-tetramethyl heptane-3,5-dionate (Sr(thd)$_2$) may be provided in the form of the corresponding tetraglyme (2,5,8,11,14-pentaoxa pentadecane, $CH_3(CH_2CH_2O)_4CH_3$) adduct or pentamethyl diethylene triamine (PA, i.e., N,N,N',N",N"-pentamethyl diethylene triamine, $(CH_3)_2N—CH_2CH_2—N(CH_3)—CH_2CH_2—N(CH_3)_2$) adduct.

Typically, the mixture is provided in a solvent system of tetrahydrofuran/isopropyl alcohol/tetraglyme such as in a molar ratio of 8:2:1, respectively, or in a solvent system of octane/decane/pentamethyl diethylene triamine such as in a molar ratio of 5:4:1, respectively.

In particular, the mixture may be provided, e.g., in a stoichiometric ratio, for forming a ferroelectric material comprising $SrBi_2Ta_2O_9$ from the metal oxide ceramic layer on the substrate, and the substrate on which the metal oxide ceramic layer is formed may be thereafter ferroannealed at an annealing temperature of about 650–820° C. in oxygen or air at a pressure of about 1 atmosphere. Where the substrate comprises silicon containing a surface layer of a metal, e.g., Pt, after the substrate is ferroannealed, another layer of said metal is provided on the metal oxide ceramic layer, and the substrate is thereafter again ferroannealed at said temperature and pressure in oxygen or air, to form a capacitor having two layers of said metal as the top and bottom electrodes separated by the metal oxide ceramic layer as a dielectric.

The invention also contemplates the capacitor product made by the above described method.

According to one preferred embodiment, a method of forming a bismuth oxide ceramic layer on a substrate by CVD is provided, comprising conducting a gaseous flow of an oxygen-containing inert carrier gas comprising about 40–80% oxygen and a vaporized solution of a precursor organo bismuth compound in a volatile organic solvent, in the presence of a protonating additive substance in gaseous state comprising water, a volatile carboxylic acid compound, a volatile ketone, a volatile amine or ammonia, into contact with a surface portion of the substrate under a vacuum pressure of about 0.1–100 Torr at a thermal decomposition temperature of about 150–800° C. to convert the precursor compound to its corresponding bismuth oxide, e.g., having the same oxidation state as in the precursor compound.

The additive substance is present in an amount sufficient to facilitate the thermal decomposition of the precursor compound and control the in situ oxidation state of the deposited metal and the amount of oxygen in the formed layer, e.g., while suppressing the formation of volatile intermediates and of vacancies in the formed layer, as noted above.

According to another preferred embodiment, a method of forming a bismuth oxide ceramic layer on a substrate by CVD is provided, comprising conducting a gaseous flow of an oxygen-containing inert carrier gas comprising about 40–80% oxygen and a vaporized solution of a mixture of precursor organo metal compounds comprising a precursor triorgano bismuth compound, a precursor diorgano strontium compound and a precursor pentaorgano tantalum compound in a volatile organic solvent, in the presence of a protonating additive substance in gaseous state comprising water, a carboxylic acid compound, a ketone, an amine or ammonia, as aforesaid, into contact with a surface portion of the substrate under a vacuum pressure of about 0.1–100 Torr at a thermal decomposition temperature of about 150–800°

C. to convert the triorgano bismuth compound to bismuth trioxide, the diorgano strontium compound to strontium monoxide and the pentaorgano tantalum compound to tantalum pentoxide.

The additive substance is present in an amount sufficient to facilitate the thermal decomposition of the triorgano bismuth compound, the diorgano strontium compound and the pentaorgano tantalum compound and to control the in situ oxidation state of the corresponding deposited metal and the amount of oxygen in the formed layer, while suppressing the formation of volatile intermediates and of vacancies in the formed layer.

According to further preferred embodiment, a method of forming a bismuth oxide ceramic layer on a substrate by CVD is provided, comprising conducting a gaseous flow of an oxygen-containing inert carrier gas comprising about 40–80% oxygen and a vaporized solution of a mixture of precursor organo metal compounds comprising bismuth tris-2,2,6,6-tetramethyl heptane-3,5-dionate or triphenyl bismuth, plus strontium bis-2,2,6,6-tetramethyl heptane-3,5-dionate and tantalum 2,2,6,6-tetramethyl heptane-3,5-dionate tetra isopropoxide, e.g., in a molar ratio of 0.25:0.15:0.40, in a volatile organic solvent comprising tetrahydrofuran/isopropyl alcohol/tetraglyme in a molar ratio of 8:2:1, or octane/decane/pentamethyl diethylene tri-amine in a molar ratio of 5:4:1, in the presence of a protonating additive substance in gaseous state comprising water, a carboxylic acid compound, a ketone, an amine or ammonia, as aforesaid, into contact with a surface portion of the substrate under a vacuum pressure of about 0.1–100 Torr at a thermal decomposition temperature of about 150–800° C. for converting the bismuth tris-2,2,6,6-tetramethyl heptane-3,5-dionate or the bismuth tripenyl to bismuth trioxide, the strontium bis-2,2,6,6-tetramethyl heptane-3,5-dionate to strontium monoxide and the tantalum 2,2,6,6-tetramethyl heptane-3,5-dionate tetra isopropoxide to tantalum pentoxide.

The additive substance is present in an amount of about 0.01–200 mols per mol of each of the corresponding bismuth tris-2,2,6,6-tetramethyl heptane-3,5-dionate or bismuth triphenyl, plus strontium bis-2,2,6,6-tetramethyl heptane-3,5-dionate and tantalum 2,2,6,6-tetramethyl heptane-3,5-dionate tetra isopropoxide, for facilitating the thermal decomposition of the precursor organo compounds and for controlling the in situ oxidation state of the corresponding deposited metal and the amount of oxygen in the formed layer, e.g., while suppressing the formation of volatile intermediates and of vacancies in the formed layer.

According to a second aspect of the invention, a method of forming a metal oxide ceramic layer on a substrate by CVD is provided, comprising conducting a gaseous flow of a vaporized solution of a precursor organo metal compound in a volatile organic solvent, e.g., plus an oxidizing gas, in the presence of a protonating additive substance in gaseous state comprising a volatile lower alcohol having 1–4 carbon atoms, into contact with a surface portion of the substrate under a vacuum pressure at a thermal decomposition temperature below 450° C., such as about 300–445° C. in the case of a silicon substrate, or about 150–350° C. in the case of a hydrocarbon based polymer substrate, for converting the precursor compound to its corresponding metal oxide, e.g., having the same oxidation state as in the precursor compound.

The alcohol additive substance is present in an amount sufficient for facilitating the thermal decomposition of the precursor compound and for controlling the in situ oxidation state of the deposited metal and the amount of oxygen in the formed layer, e.g., while suppressing the formation of volatile intermediates and of vacancies in the formed layer.

The alcohol additive substance may be present in an amount of about 25–200 mols per mol of the precursor compound. The vacuum pressure may be about 0.01–100 Torr, and especially about 0.5–20 Torr.

According to a third aspect of the invention, a method of forming a metal oxide ceramic layer on a substrate by CVD is provided, comprising conducting a gaseous flow of a vaporized solution of a precursor organo metal compound in a volatile organic solvent, e.g., plus an oxidizing gas, in the presence of an activating agent in gaseous state, into contact with a surface portion of the substrate under a vacuum pressure at a thermal decomposition temperature effective for converting the precursor compound to its corresponding metal oxide having the same oxidation state as in the precursor compound. The activating agent comprises carbon monoxide, hydrogen or a volatile lower aliphatic hydrocarbon having 1–4 carbon atoms or volatile aromatic hydrocarbon, which volatile hydrocarbon is optionally substituted by a bromo, iodo or nitro substituent, as aforesaid.

The activating agent is present in an amount sufficient for producing in situ active, especially hydrogen-active, compounds for enhancing the converting of the precursor compound to its said metal oxide and for controlling the in situ oxidation state of the deposited metal and the amount of oxygen in the formed layer, e.g., while suppressing the formation of volatile intermediates and of vacancies in the formed layer.

The decomposition temperature may be about 150–800° C., especially below 450° C., and the vacuum pressure may be about 0.01–100 Torr, preferably about 0.5–20 Torr.

The substrate may comprise silicon containing a surface layer of a metal, and the decomposition temperature may be about 300–500° C. and the vacuum pressure may be about 0.1–100 Torr, preferably about 0.5–20 Torr. Alternatively, the substrate may comprise a hydrocarbon based polymer containing a surface layer of a metal, and the decomposition temperature may be about 150–350° C. and the vacuum pressure may be about 0.1–100 Torr, preferably about 0.5–20 Torr.

The precursor compound typically comprises a mixture of bismuth tris-2,2,6,6-tetramethyl heptane-3,5-dionate or bismuth triphenyl, plus strontium bis-2,2,6,6-tetramethyl heptane-3,5-dionate and tantalum 2,2,6,6-tetramethyl heptane-3,5-dionate tetra isopropoxide, e.g., in a molar ratio of 0.25:0.15:0.40, respectively. The strontium bis-2,2,6,6-tetramethyl heptane-3,5-dionate may be provided in the form of the corresponding tetraglyme adduct or pentamethyl diethylene triamine adduct.

The mixture may be provided in a solvent system of tetrahydrofuran/isopropyl alcohol/tetraglyme, such as in a molar ratio of 8:2:1, respectively, or of octane/decane/pentamethyl diethylene triamine, such as in a molar ratio of 5:4:1, respectively.

The invention will be more readily understood from the following detailed description taken with the accompanying drawings and claims.

It is noted that the drawings are not to scale, some portions being shown exaggerated to make the drawings easier to understand.

DETAILED DESCRIPTION

Figure 1:
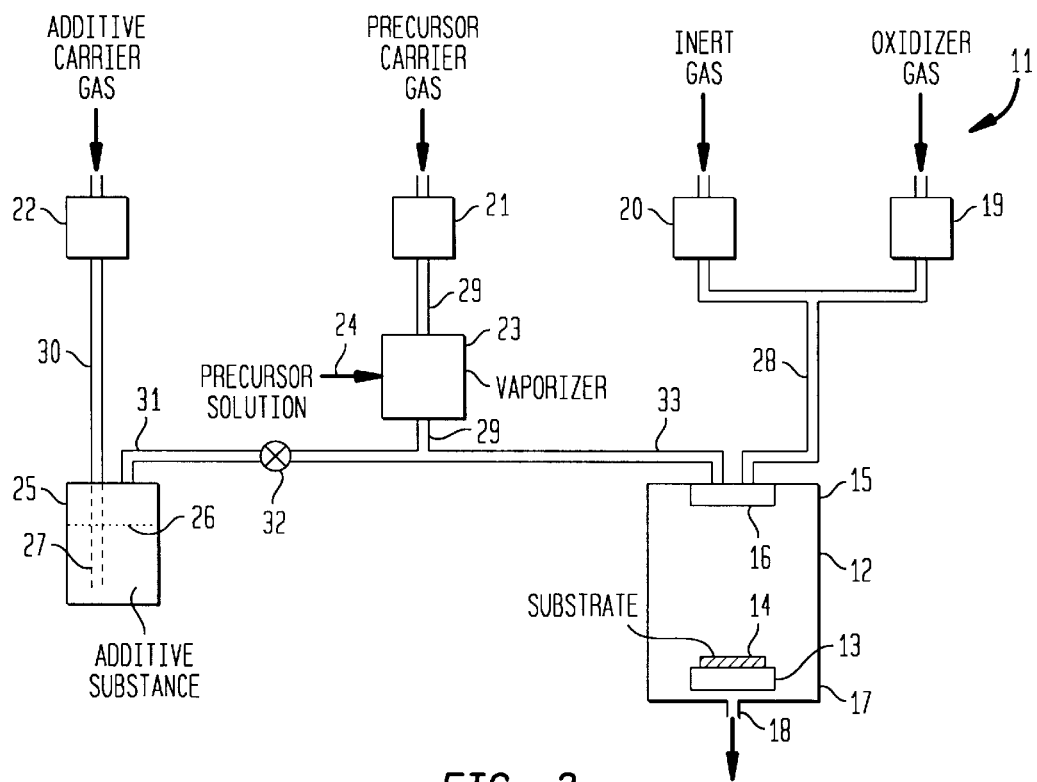
FIGS. 1, 2 and 3 are side views, respectively illustrating three different known forms of CVD reactors usable for forming a metal oxide ceramic layer according to the invention.
Figure 2:
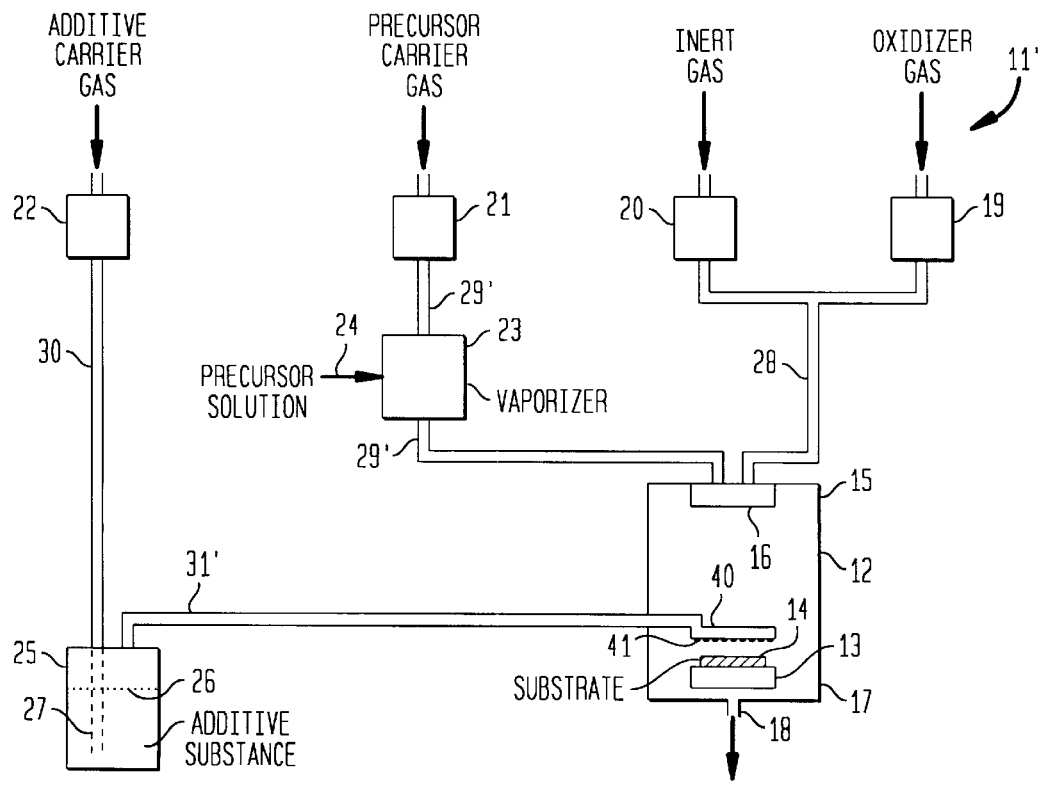
Figure 3:
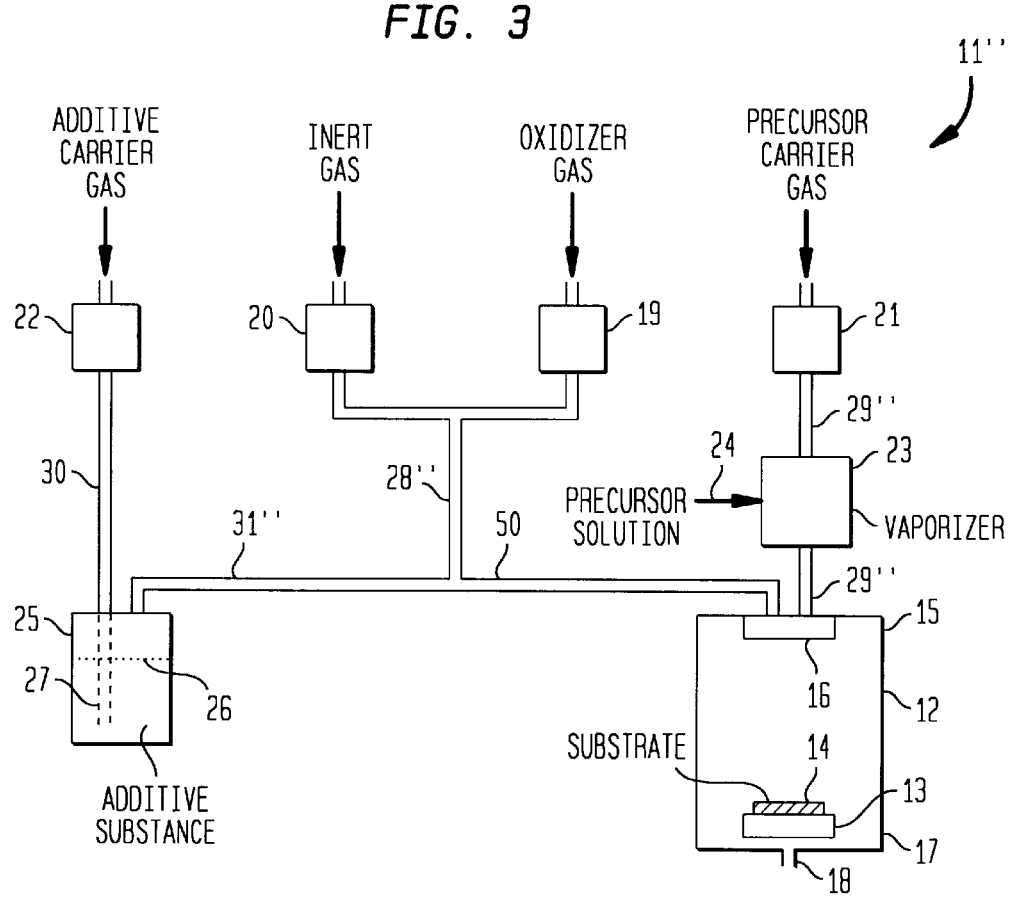

Referring now to FIGS. 1, 2, and 3, there are shown three similar conventional CVD reactors arranged as cold wall reactors.

FIG. 1 includes reactor arrangement 11, chamber 12, heater 13, substrate 14, inlet end 15, distributor 16, outlet end 17, exhaust 18, mass flow controllers 19, 20, 21 and 22, vaporizer 23, inlet 24, bubbler 25, liquid level 26, delivery tube 27, feed lines 28, 29, 30 and 31, valve 32 and feed line 33.

FIG. 2 includes above items 11–27 and 30, and modified items 29' and 31', while omitting items 32–33, and further includes flow ring 40 and nozzles 41.

FIG. 3 includes above items 11–27 and 30, and modified items 28", 29" and 31", while omitting items 32–35, and further includes feed line 50.

FIG. 1 shows arrangement 11 having a cold wall type CVD reactor chamber 12, typically maintained at about 140–240° C., in which is situated a substrate heater 13 for heating, e.g., to about 385° C., a wafer substrate 14, e.g., of silicon typically having an inner silicon dioxide layer, an intermediate titanium layer and an outer platinum surface layer (Si/SiO$_2$/Ti/Pt), disposed on heater 13. At the reactor inlet end 15, an inlet flow distributor 16 (called a shower head) is located, and at the reactor outlet end 17, an outlet flow exhaust 18 is disposed which is connected to a cold trap and in turn a vacuum pump (not shown).

Mass flow controllers 19 and 20 control the inlet flows to reactor chamber 12 from respective gaseous material supply sources (not shown) for the oxidizer gas, e.g., oxygen or nitrogen oxide, and its inert carrier gas, e.g., argon (Ar) or other noble gas or nitrogen (N$_2$), fed in combined form to reactor chamber 12 via feed line 28, for distribution through distributor 16.

Mass flow controller 21 controls the inlet flow to reactor chamber 12 from the gaseous material supply source (not shown) for the precursor inert carrier gas, e.g., argon, which is fed via feed line 29 through vaporizer 23 into which the solution of the precursor organo metal compounds in the solvent system therefor is fed via inlet 24 for flash evaporation to gaseous form, such that the combined flow is fed via feed line 29 to combined flow feed line 33 to reactor chamber 12 for distribution through distributor 16.

Mass flow controller 22 controls the inlet flow to reactor chamber 12 from the gaseous material supply source (not shown) for the protonating additive substance inert carrier gas, e.g., argon, which is fed via feed line 30 to the heatable liquid bubbler 25 for bubbling from delivery tube 27 (shown in dashed line) through the liquid level 26 (shown in dotted line) of liquid form protonating additive substance in bubbler 25 to entrain the additive substance in gaseous state therein for delivery via feed line 31, controlled by manual valve 32, to combined flow feed line 33 for combined flow with the gaseous form precursor solution from feed line 29 into reactor chamber 12 through distributor 16.

The introduced gaseous flow mixture of oxidizing gas, precursor organo metal compounds in their solvent system, and protonating additive substance, is directed into contact with the exposed surface of heated substrate 14 for decomposition reaction at the prevailing temperature, e.g., 385° C., in the boundary layer in the immediate vicinity of the surface layer of substrate 14 (the boundary layer being that part of the gas phase that is closest to the substrate surface). This results in the progressive deposition of the desired metal oxide ceramic layer, with the residual gaseous flow of the ingredients being removed from reactor chamber 12 via exhaust 18.

FIG. 2 shows arrangement 11' which only differs from arrangement 11 of FIG. 1 in that valve 32 and feed line 33 are omitted, feed line 29' is arranged for feeding the precursor organo metal compound gaseous flow separately to distributor 16, while feed line 31' is arranged for feeding the protonating additive substance gaseous flow separately to reactor chamber 12 immediately at the exposed surface of substrate 14 via inlet nozzles 41 of flow ring 40 located in reactor chamber 12 in closely facing relation to the exposed surface of substrate 14. This arrangement permits more immediate availability of the protonating additive substance to the exposed surface of substrate 14 at the boundary layer thereat.

FIG. 3 shows arrangement 11" which only differs from arrangement 11 of FIG. 1 in that valve 32 and feed line 33 are omitted, feed line 29" is arranged-for feeding the precursor organo metal compound gaseous flow separately to distributor 16, and feed line 28" is arranged for feeding the oxidizer gas into combined flow feed line 50 together with the protonating additive substance gaseous flow from feed line 31" to distributor 16.

Initial investigation of a CVD process for SBT, i.e., strontium bismuth tantalate, SrBi$_2$Ta$_2$O$_9$, was carried out using as the precursor organo metal compounds a mixture of (1) Sr(thd)$_2$(tetraglyme), i.e., the tetraglyme (2,5,8,11,14-pentaoxa pentadecane) adduct of strontium bis-2,2,6,6-tetramethyl heptane-3,5-dionate, (2) BiPh$_3$, i.e., Bi-triphenyl, and (3) Ta(thd)(OiPr)$_4$, dissolved in a mixture of the solvents THF (tetrahydrofuran), iPrOH (isopropyl alcohol) and tetraglyme in a solvent molar ratio of 8:2:1, respectively.

This solution was evaporated in a vaporizer and the vapors were transferred with Ar (argon) as inert carrier gas to an exposed hot surface of a substrate heated to 400–650° C. in a cold wall CVD reactor chamber of the type shown in FIGS. 1–3. A mixture of the oxides SrO, Bi$_2$O$_3$ and Ta$_2$O$_5$ was deposited on the substrate surface, using oxygen (O$_2$) as oxidizer at a total pressure of between 0.5–10 Torr.

It was observed that the deposition of Bi$_2$O$_3$ bears some difficulties under the above conditions. It was found that the dependence of the deposition rate of Bi$_2$O$_3$ on the total reactor chamber pressure is inverse to the other two oxides SrO and Ta$_2$O$_5$. At low pressure, e.g., 1 Torr, the deposition rate of Bi$_2$O$_3$ is almost zero, whereas if the pressure is increased, the deposition rate first slowly increases, but then after a certain threshold pressure rapidly increases. If the pressure is high, e.g., above 6–8 Torr, the Bi$_2$O$_3$ deposition rate levels off and shows only a small dependence on the total pressure. From 6–10 Torr, the $Bi_2O_3$ deposition rate is usually very high.

The behavior of the oxides from the other two precursors at different pressures is quite different. At low pressures the deposition rates of SrO and $Ta_2O_5$ are high and at high pressures they are low. For an approximation, their deposition rate-pressure dependence can be described by an exponential function. Because pressure has a different influence on the deposition rate of the oxides of the given precursor organo metal compounds, they are not well matched in the deposition process.

In addition, it was found that the substrate has a significant influence on the deposition rate. Thus, the deposition rate is highest on a Pt substrate, with a rough Pt surface being preferred over a smooth Pt surface, and is lowest on a silicon dioxide ($SiO_2$) substrate. Indeed, SrO and $Ta_2O_5$, both of which are oxides of SBT, impede the deposition of $Bi_2O_3$.

A further problem is the low reproducibility for deposited films or layers of metal ceramic oxide such as SBT which have about 40% Bi. The fluctuation of the Bi content in films deposited under the same conditions is often too high.

While the matter is not fully understood at this time, it is believed that a difference in chemistry and in the decomposition behavior on the hot substrate may be the reasons for the different deposition behavior of the strontium, bismuth and tantalum precursor compounds and the low degree of reproducibility that is encountered.

In the precursor combination of $Sr(thd)_2(tetragiyme)$, i.e., the tetraglyme (2,5,8,11,14-pentaoxa pentadecane) adduct of strontium bis-2,2,6,6-tetramethyl heptane-3,5-dionate, $BiPh_3$, and $Ta(thd)(OiPr)_4$, the Sr and Ta precursors are both β-diketonates and have a metal-O—C (metal-oxygen-carbon) linkage. A decomposition of these precursor at the hot substrate surface can take place by just cleaving the O—C bond. In addition, this process can be facilitated by molecular rearrangements. Related experiments have shown that no additional oxygen is necessarily required from the gas phase for effecting such cleavage and for yielding the corresponding oxides.

In contrast thereto, $BiPh_3$ has a quite different chemistry or chemical behavior. Because the molecule itself contains no oxygen, oxygen from the attendant gas phase is necessary to form $Bi_2O_3$. In addition, the energy required for cracking the molecule is higher than for the other two precursors, because no rearrangements are possible. It is believed that a critical, and perhaps first, step in the combustion of the Bi precursor is a cleavage of the Bi—C bond at the hot substrate surface. This would explain the clear influence of the chemical nature of the substrate on the $Bi_2O_3$ deposition.

After such first step, a sequence of further degradation steps must follow during which the organic residues are removed successively and replaced by oxygen-containing ligands or oxygen atoms. The thereby formed intermediates, however, still contain organic residues, and thus have a certain volatility. It is also possible that other volatile Bi compounds are formed such as $BiPh_3$, i.e., by back reaction, $Bi_2Ph_4$, $PhOBiPh_2$, etc.

As compared to the SrO and $Ta_2O_5$ deposition, there is a constant leaving mechanism for Bi during the $Bi_2O_3$ deposition. Only the final product $Bi_2O_3$ has a fairly low volatility, but which is still detectable by simple experiments. Consequently, the lower efficiency for the $Bi_2O_3$ deposition from $BiPh_3$ at low pressures can be explained by the following factors:

that no oxygen is present in the precursor molecule, such that the oxygen needed to oxidize the Bi cation to $Bi_2O_3$ has to come from the attendant gas phase and has to be conveyed to the Bi cation during the decomposition process;

that the formed intermediates are volatile; and that a possibly higher activation energy is involved in the first step decomposition of the bismuth precursor than for the other two precursors.

The low reproducibility of the SBT deposition can be explained by considering the $Bi_2O_3$ deposition to be impeded by the simultaneously deposited SrO and $Ta_2O_5$.

Aside from the use of other oxidizing agents, e.g., than oxygen, the present invention solves the above noted underlying problems by utilizing additional molecules, comprising the stated protonating additive substances and/or activating agents, which are suited to come into action during the decomposition of the organo metal compound such as $BiPh_3$. These additive substances and/or activating agents serve to increase the efficiency of the existing decomposition pathways, or develop new decomposition pathways which are faster and more efficient, which have less volatile intermediates, and which lead to more uniform deposition of the desired metal oxide ceramic layer or film. These additive substances and/or activating agents can interact at the following locations:

a) in the boundary layer by direct interaction with the $BiPh_3$;

b) at the substrate surface by reaction with the $BiPh_3$ or with the produced intermediates;

c) by changing the active surface of the substrate.

Examples of the additive substance are:

A) Molecules which possess acidic protons for protonating the pertinent organo groups of the precursor such as the phenyl groups of $BiPh_3$, and thereby cause cleavage of the precursor molecule. Thus, a Bi compound is formed from which one, two or all three organo groups such as phenyl is missing, and which is therefore more reactive for further thermal decomposition to the desired $Bi_2O_3$. Especially suited for this purpose are O—H and N—H containing acidic molecules. These include water ($H_2O$), volatile carboxylic acid compounds, volatile ketones, volatile amines and ammonia ($NH_3$ gas). They also include alcohols.

Examples of the activating agent are:

B) Molecules which interact in a different way from that contemplated in A) above. These include carbon monoxide, hydrogen ($H_2$) and volatile lower aliphatic hydrocarbons having 1–4 carbon atoms or aromatic hydrocarbons such as benzene, toluene and xylene, optionally substituted with a bromo, iodo or nitro (—$NO_2$) substituent.

These additional molecules A) and/or B) can be efficiently transferred to the reactor chamber by an inert carrier gas such as argon (Ar) or nitrogen ($N_2$). In the reactor chamber, they are mixed with the precursor compounds in gaseous state in their volatilized solvent and also with the oxidizing gas.

As to water, it reacts at the hot substrate surface or in the hot boundary layer immediately adjacent thereto, with the precursor organo metal compound such as $BiPh_3$ according to the reaction:

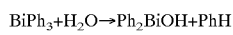

$Ph_2BiOH$ is a reactive, oxygen-containing species which can be transformed into $Bi_2O_3$ by further reaction with attendant water. In addition, water is capable of chemically modifying the substrate surface in such a way that it is provided with adsorbed OH groups. This results in new decomposition pathways, e.g.,

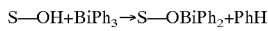
S—OH+BiPh$_3$→S—OBiPh$_2$+PhH wherein S represents the substrate surface. This results in a more efficient bonding of the molecule to the substrate surface.

As to other OH acidic compounds such as light or volatile carboxylic acids, anhydrides, esters, nitriles, isonitriles and aldehydes, as well as volatile ketones, these react in a similar manner. For instance, formic acid (HCOOH), acetic acid (CH$_3$COOH), etc. can act in protonating manner towards BiPh$_3$ and simultaneously form a coordinate Bi—O bond.

As to volatile amines, e.g., R$^1{}_2$NH, R$^1$,R$^2$NH and R$^1$NH$_2$, wherein R$^1$ and R$^2$ are lower aliphatic or aromatic hydrocarbons, as well as ammonia NH$_3$, these molecules behave similarly to water, but are less acidic and thereby interact with the precursor compounds and intermediates more gently. The formed Bi amines are effective Bi precursors.

As to alcohols R-OH, these include volatile alcohols such as methanol (CH$_3$OH), ethanol (CH$_3$CH$_2$OH), n-propyl alcohol (nPrOH), i-propyl alcohol (iPrOH), etc. Like water, they react at the hot substrate surface or in the hot boundary layer immediately adjacent thereto, with the precursor organo metal compound such as BiPh$_3$ according to the reaction:

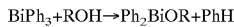
BiPh$_3$+ROH→Ph$_2$BiOR+PhH

Ph$_2$BiOR is a reactive, oxygen-containing species which can be transformed into Bi$_2$O$_3$ by further reactions. In addition, most alcohols are reducing in action and are thus capable of chemically modifying the substrate surface by a reduction reaction which may lead to activation of the substrate surface.

As to carbon monoxide, this is believed to undergo an insertion reaction in which the molecule is inserted into the precursor organo metal compound bond between the Bi atom and the organo ligand, such as into the Bi-Ph bond of BiPh$_3$ so as to yield an active, especially hydrogen-active, Bi species with a Bi—CO—Ph group which is more reactive.

As to hydrogen, this can interact in two ways during the decomposition reaction, i.e., in the boundary layer immediately adjacent the substrate surface by participating in radical reactions, or at the substrate surface. As a consequence, the substrate surface is modified by adsorption of H atoms, which can interact with intermediates, e.g., by trapping Ph residues bound to the substrate surface and transforming them into volatile PhH (benzene). A permanent partial reduction of the substrate surface is also believed to occur which changes (increases) the chemical potential of the substrate surface for further reaction. In addition, hydrogen combustion creates water.

For example, hydrogen may partially reduce the SrO/Bi$_2$O$_3$/Ta$_2$O$_5$ surface, which is the surface on which the film grows, i.e., after the initial reaction period, to form lower valent Bi species, e.g., Bi$^{2+}$ cations, which are more reactive.

As to hydrocarbons, i.e., volatile, especially normally gaseous, lower aliphatic hydrocarbons having 1–4 carbon atoms such as methane (CH$_4$), ethane (C$_2$H$_6$) and similar lower alkanes, including those optionally substituted by bromo, iodo or nitro substituents, e.g., ethyl bromide (C$_2$H$_5$Br), methyl iodide (CH$_3$I) and nitromethane (CH$_3$NO$_2$), as well as aromatic hydrocarbons such as benzene, toluene and xylene, optionally substituted by said bromo, iodo, or nitro substituents, e.g., bromo benzene, iodo benzene, and nitro benzene, these can be cleaved at the hot substrate surface into H atoms and aliphatic or aromatic fragments such as alkyl or phenyl moieties. These species can modify the substrate surface or interact with the decomposition pathways. In addition, their combustion generates water, which can interact as described above.

In particular, as to the volatile carboxylic acid compounds, and the volatile ketones, these include volatile aliphatic and aromatic hydrocarbon carboxylic acids and their volatile corresponding anhydrides, esters, nitriles, isonitriles and aldehydes, as well as aliphatic and aromatic ketones. They also include the corresponding keto-enol tautomeric compounds, e.g., containing acidic α-H (α-hydrogen) groups such as vinyl alcohol and acetaldehyde.

The volatile carboxylic acids comprise those of the formula R$^3$COOH wherein R$^3$ is an aliphatic or aromatic hydrocarbon radical including alkyl, alkenyl or aryl, especially lower alkyl and lower alkenyl, e.g., each having 1–4 carbon atoms, and aryl of 6–10 ring carbon atoms, e.g., phenyl and naphthyl. Examples include formic acid, acetic acid, propionic acid, butanoic acid acrylic acid (2-propenoic acid), crotonic acid (β-methylacrylic acid), isocrotonic acid (2-butenoic acid), benzoic acid, naphthoic acid, etc.

The volatile carboxylic acid anhydrides comprise those of the formula R$^3$CCOR$^4$ wherein R$^3$ is the same as defined above and R$^4$ is an aliphatic or aromatic hydrocarbon carbonyl radical including alkanoyl, alkenoyl or aroyl, especially lower alkanoyl and lower alkenoyl, e.g., each having 1–4 carbon atoms, and aroyl of 6–10 ring carbon atoms, e.g., benzoyl and naphthoyl. Examples include acetic anhydride, propionic anhydride, butanoic anhydride, acrylic anhydride, crotonic anhydride, isocrotonic anhydride, benzoic anhydride, 1-naphthoic anhydride, etc.

The volatile carboxylic acid esters comprise those of the formula R$^3$COOR$^3$ wherein each R$^3$ independently is the same as defined above, such that the two R$^3$ groups are the same or different. Examples include the corresponding methyl, ethyl, n- and iso-propyl, n-, iso-, sec- and tert-butyl, vinyl, allyl, 1- and 2-propenyl, 1-, 2- and 3-butenyl, phenyl, naphthyl, etc. esters of the above enumerated acids.

The volatile carboxylic acid nitriles and isonitriles (i.e., isocyanides) comprise those nitriles of the formula R$^3$CN and those isonitriles of the formula R$^3$NC wherein R$^3$ in each case is the same as defined above. Examples include ethane- (aceto-), propane- (propio-), butane-, propene-, benzene- (benzo-), naphthalene- (naphtho-), etc. -nitrile and -isonitrile (isocyanide).

The volatile carboxylic acid aldehydes comprise those of the formula R$^3$CHO wherein R$^3$ is the same as defined above. Examples include formaldehyde, acetaldehyde, propionaldehyde, butyraldehyde, acrylic aldehyde (acrolein), crotonaldehyde, benzaldehyde, naphthaldehyde, etc.

The volatile ketones comprise those of the formula R$^3$COR$^3$ wherein each R$^3$ independently is the same as defined above, such that the two R$^3$ groups are the same or different. Examples include acetone (propanone), methyl ethyl ketone, ethyl ketone (3-pentanone), dipropyl ketone (4-heptanone), dibutyl ketone (5-nonanone), divinyl ketone (pentadien-3-one), dipropenyl ketone (hepta-1,6-diene-4-one), dibutenyl ketone (nona-1,8-dien-5-one), diphenyl ketone, dinaphthyl ketone, etc.

As to the volatile amines, these include primary amines and secondary amines (imines) of the formulas (R$^3$)$_2$NH and R$^3$NH$_2$, respectively, wherein each R$^3$ independently is the same as defined above. Examples include methyl, ethyl, n- and iso-propyl, n-, iso-, sec- and tert-butyl amines, vinyl, allyl and 3-butenyl amines, phenylamine (aniline), naphthylamine, etc.; dimethyl amine, methyl ethyl amine, diethyl amine, ethyl-propyl amine, dipropyl amine, propyl-butyl amine, dibutyl amine, divinyl amine, diallyl amine, dibutenyl amine, diphenyl amine, dinaphthyl amine, etc.

As to the volatile alcohols, these include those of the formula ROH wherein R is an aliphatic hydrocarbon radical such as volatile alkanols and alkenols, especially lower alkanols and lower alkenols, e.g., each having 1–4 carbon atoms. Examples include methanol, ethanol, n- and iso-propanol, n-, iso-, sec- and tert-butanol, allyl alcohol (2-propen-1-ol), crotyl alcohol (2-buten-1-ol), etc.

The corresponding Keto-enol tautomeric compounds comprise those of the formula $R^3CH—C(O)—X$ (keto form) and $R^3C=C(OH)—X$ (enol form) wherein $R^3$ is the same as defined above and X is hydrogen (aldehydes), $R^3$ (ketones), OH (carboxylic acids), $—O(CO)R^3$ (anhydrides), $—OR^3$ (esters), $—N(R^3)_2$ (imides), or $—NHR^3$ (imides), each $R^3$ independently being the same as defined above, the individual $R^3$ groups being the same or different, and further comprise the related imines of the formula $R^3C=NR^3$ and imino ethers of the formula $R^3C(=NR^3)—OR^3$, wherein each $R^3$ independently is the same as defined above, such that in the last mentioned cases the $R^3$ groups are the same or different.

As to the volatile, especially normally gaseous, hydrocarbons, these include lower aliphatic hydrocarbons such as alkanes and alkenes, especially lower alkanes and lower alkenes, e.g., each having 1–4 carbon atoms, and aromatic hydrocarbons. Examples include methane, ethane, n- and iso-propane, n-, iso-, sec- and tert-butane, ethylene, propylene, butylene, benzene, toluene, xylene, etc.

As to the volatile brominated, iodinated and nitro group containing hydrocarbons, these include the corresponding bromo, iodo and nitro group substituted aliphatic hydrocarbons and aromatic hydrocarbons to those hydrocarbons enumerated above.

By the application of these additive substances and/or activating agents, new reaction pathways are generated for the decomposition of precursor organo metal compounds such as organo Bi compounds, in particular Bi aryls, especially $BiPh_3$. By increasing the efficiency of the precursor compound decomposition and suppression of volatile intermediates, a higher deposition rate of the metal oxide such as $Bi_2O_3$, especially at low pressures, is attained. Because of the employment of different, more efficient decomposition pathways, the dependence on or influence of the substrate is repressed, thereby enhancing the reproducibility of the method.

Referring now to FIG. 1, in accordance with one example, a mixture of the precursors $Sr(thd)_2$(tetraglyme), $BiPh_3$ and $Ta(thd)(OiPr)_4$, dissolved in a mixture of THF, iPrOH and tetraglyme in a molar ratio of 8:2:1, respectively, is fed via inlet 24 to vaporizer 23, provided as a flash vaporizer for efficient flash vaporizing and entrainment in the inert Ar carrier gas flowing through feed line 29 to the combined flow feed line 33 to distributor 16. This vaporized precursor flow is combined in feed line 33 with the flow of the volatilized protonating additive substance, e.g., water, formic acid, methyl amine, methanol, etc., entrained in the inert Ar carrier gas which passes from bubbler 25 through feed line 31.

Also fed to distributor 16 is the oxidizing gas, i.e., oxygen, in the inert Ar carrier gas flow in feed line 28.

These flows are blended in distributor 16 and pass into contact with the hot surface of substrate 14 in reaction chamber 12. The total gas flows are between about 500 and 3000 sccm, the $O_2$ content is between about 20 and 80%, the total pressure is between about 0.1 and 10 Torr, and the temperature of the substrate surface is between about 400 and 700° C. The substrate is silicon dioxide having an exposed platinum top layer ($Pt/SiO_2$), or alternatively may be titanium having an exposed platinum top layer (Pt/Ti).

Of course, where the additive substance (or activating agent) is normally in gaseous state, e.g., ammonia, bubbler 25 is not needed, and the gaseous additive substance (or activating agent) may simply be conveyed in its inert carrier gas directly via feed line 31. Also, where the additive substance (or activating agent) is a liquid of increased boiling point, bubbler 25 may be heated by suitable heating means (not shown) to assure efficient vaporization and entrainment in its inert carrier gas.

In the usual case, e.g., where methanol, which has a low boiling point of 65° C. at 760 Torr, is used as the additive substance, it is disposed in bubbler 25 which is maintained at a temperature of 20–50° C. By flowing Ar as inert carrier gas through bubbler 25, methanol is readily evaporated and transported from the bubbler via feed line 31 under the gas flow control of mass flow controller 22. After exiting from bubbler 25 via feed line 31, the pressure drops at a nozzle (not shown) whose downstream side is at the pressure of reactor chamber 12.

The Ar/methanol mixture is combined with the $Ar/O_2$ mixture and the Ar/vaporized precursor solution mixture in distributor 16 before they enter reactor chamber 12. The amount of protonating additive substance, e.g., methanol, is set at about 0.01–200 molecules (moles) per molecule (mole) of the organo metal compound such as $BiPh_3$.

Where the protonating additive substance is water, the process is effected in similar manner, with the difference being that the temperature of the bubbler 25 is maintained at between 40 and 80° C.

The above described process may be carried out in similar manner using arrangement 11' of FIG. 2 or arrangement 11" of FIG. 3, as earlier discussed.

The use of the protonating additive substance (or activating agent) permits the CVD of metal oxide ceramic layers such as bismuth oxide ceramic layers to be carried out at an increased deposition rate, due to the facilitated decomposition of the precursor organo metal compound, leading to a lower substrate sensitivity, e.g., for $Bi_2O_3$ deposition from all pertinent Bi precursors such as Bi aryls and particularly $BiPh_3$ as well as Biβ-diketonates. Substrate sensitivity involves the undesired preferred deposition of particular substances in selective areas under certain process conditions.

Significantly, the use of protonating additive substance (or activiating agent) also permits lower deposition temperatures.

In addition, as discussed below, the use of the protonating additive substance (or activating agent) also permits control of the morphology and composition of the as-deposited phase. The structure of the as-deposited phases crucially determine the final electrical properties of the annealed thin film, because the morphology and composition of this phase strongly influence the way the phase transition to the ferroelectric phase occurs during the ferroanneal after-treatment.

In regard to use of a Biβ-diketonate as the precursor, excellent CVD results have been obtained, such as high run-to-run repeatability, low substrate sensitivity and good electrical properties. The specific precursor combination used was $Bi(thd)_3$, i.e., bismuth tris-2,2,6,6-tetramethyl heptane-3,5-dionate, $Sr(thd)_2$, i.e., strontium bis-2,2,6,6- tetramethyl heptane-3,5-dionate, and Ta(thd)(OiPr)$_4$, i.e., tantalum 2,2,6,6-tetramethyl heptane-3,5-dionate tetra isopropoxide. For the Sr precursor, the tetraglyme adduct was used, i.e., Sr(thd)$_2$(tetraglyme).

The above three precursors were dissolved in the standard solvent system of THF/iPrOH/tetraglyme, i.e., tetrahydrofuran/isopropyl alcohol/tetraglyme, in a molar ratio of 8:2:1, respectively. The precursor solution was delivered to the flash vaporizer 25 and evaporated at 190° C.

Although excellent CVD results were obtained using the above mixture of precursor compounds in the standard solvent system, it was found that the evaporation process experienced a problem in that the formation of residues in the vaporizer was observed which caused delivery tube clogging. This prompted a change in the solvent system to octane/decane/PA, wherein PA is N,N,N',N",N"-pentamethyl diethylene triamine, in a molar ratio of 5:4:1, respectively. For the Sr precursor, said pentamethyl diethylene triamine adduct was used, i.e., Sr(thd)$_2$(PA).

While the precursors remained the same, except for the above noted modification in the Sr precursor, different deposition characteristics were observed during the CVD process. These are attributable to an effect of the solvent vapors on the formation of the metal oxides from their corresponding precursors during their decomposition on or right before the hot substrate surface.

It should be noted that a given solvent in the solvent system is used in adduct form to add another ligand to the organo metal compound, e.g., organo strontium compound, for lowering the evaporation temperature used to convert the precursor solution from liquid phase to gaseous phase.

Figure 4:
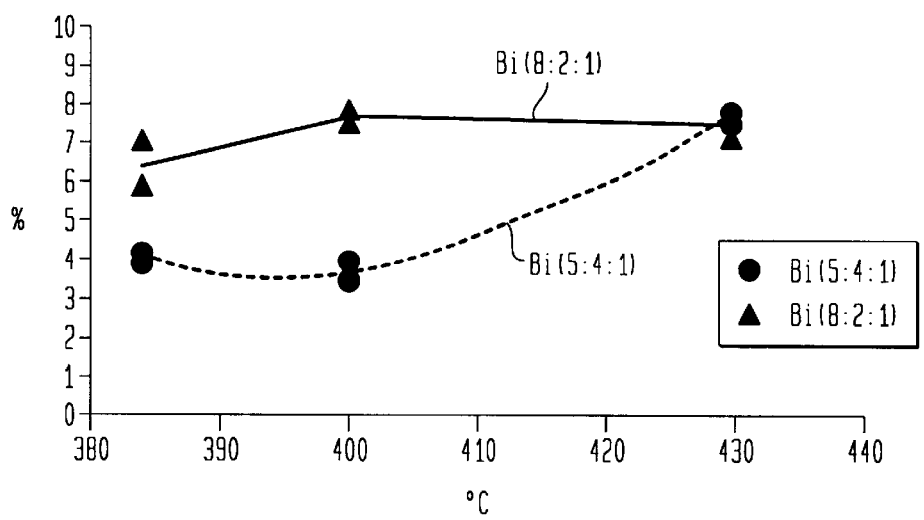
FIG. 4 is a graph showing bismuth (Bi) deposition efficiencies at different temperatures.
Figure 5:
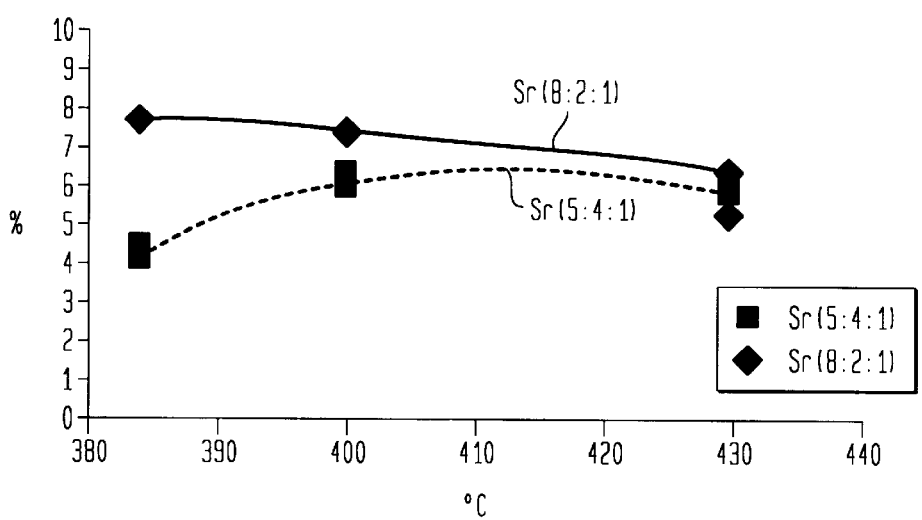
FIG. 5 is a graph showing strontium (Sr) deposition efficiencies at different temperatures.
Figure 6:
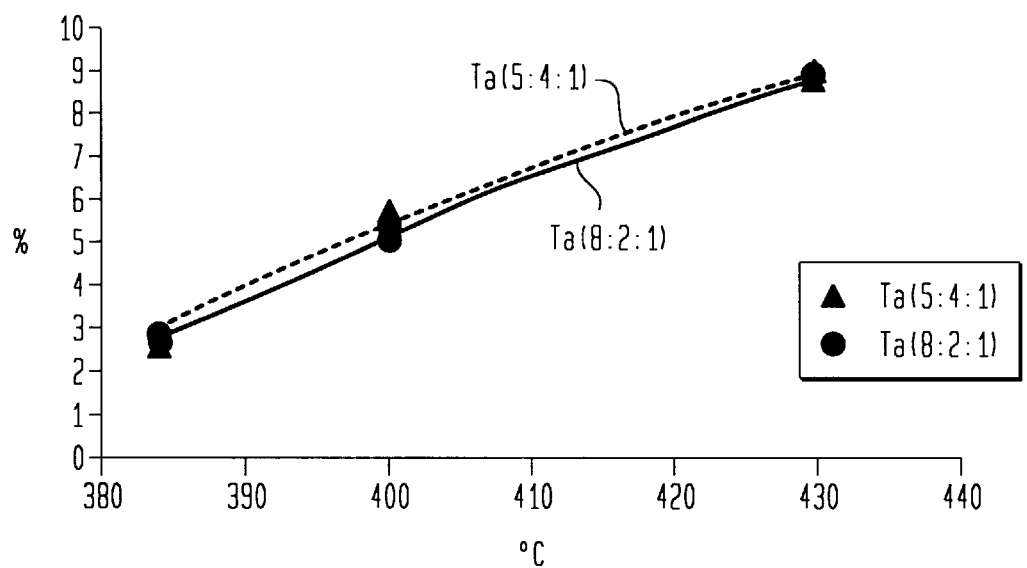
FIG. 6 is a graph showing tantalum (Ta) deposition efficiencies at different temperatures.
Figure 7:
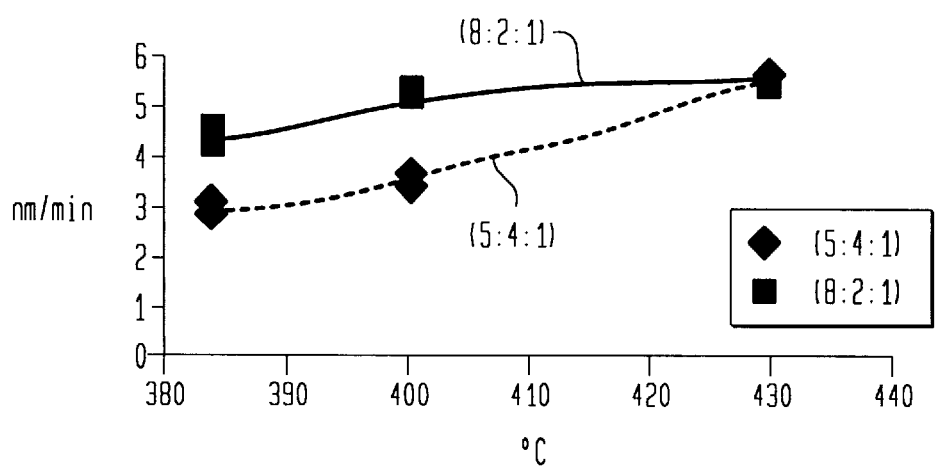
FIG. 7 is a graph showing deposition layer growth rates of the metal oxide ceramic layer at different temperatures.

Referring now to FIGS. 4–7, four graphs are shown indicating how the deposition efficiencies of the three metal oxides change with changing temperature (FIGS. 4–6) and how the differences in deposition efficiency influences the growth rate of the deposited metal oxide ceramic layer (FIG. 7). Specifically, FIG. 4 shows the Bi deposition efficiencies (%) at different temperatures, FIG. 5 shows the Sr deposition efficiencies (%) at different temperatures, and FIG. 6 shows the Ta deposition efficiencies (%) at different temperatures, while FIG. 7 shows the growth rate (nm/min).

As to FIGS. 4–7, the THF/iPrOH/tetraglyme solvent system in the 8:2:1 molar ratio (graph solid line), identified as Bi (8:2:1) in FIG. 4, as Sr (8:2:1) in FIG. 5, as Ta (8:2:1) in FIG. 6, and (8:2:1) in FIG. 7, was used in one set of runs. The octane/decane/PA solvent system in the 5:4:1 molar ratio (graph dashed line), identified as Bi (5:4:1) in FIG. 4, as Sr (5:4:1) in FIG. 5, as Ta (5:4:1) in FIG. 6, and as (5:4:1) in FIG. 7, was used in another set of runs.

As to FIGS. 4–6, the efficiency is defined as the amount of metal oxide which forms divided by the amount of precursor provided in the gas phase. It is clear that the Bi deposition efficiency, i.e., within the temperature range of 380–430° C., is significantly affected by the solvent vapors (FIG. 4), whereas the Ta deposition efficiency, i.e., within the temperature range of 380–430° C., under the same conditions is independent of the change in the solvent system (FIG. 6). The difference in Sr deposition efficiency, i.e., within the temperature range of 380–430° C., is either attributable to the change in the solvent system or the change in the adduct ligand (FIG. 5).

As to FIG. 7, it is clear that the difference in efficiencies also has an influence on the growth rate of the metal oxide ceramic layer, the growth rate being higher where the THF/iPrOH/tetraglyme solvent system is used.

To explain these results, it is assumed that the THF and/or iPrOH vapors facilitate the decomposition of the Bi(thd)$_3$ precursor, with the alcohol (iPrOH) acting as a proton donor (a substance yielding a hydrogen ion) and opening up new decomposition pathways for the Bi precursor. A possible pathway is a ligand exchange, i.e., which exchanges a thd ligand by an OiPr ligand according to the reaction:

Bi(thd)$_3$+iPrOH→Bi(thd)$_2$(OiPr)+Hthd

The intermediate Bi(thd)$_2$(OiPr) would then have a more efficient decomposition on the hot substrate surface. The higher decomposition efficiency for such an intermediate is explainable in terms of a better sticking coefficient of this Bi species compared to Bi(thd)$_3$ or a faster cleavage mechanism. It is noted that an OiPr ligand is easily cleaved at the O—C bond via propylene (CH$_2$=CH$_2$) elimination.

As to Bi loss, it has been observed that Bi is always lost into the bottom electrode, in this case a Pt electrode, i.e., the exposed top layer on the substrate used. Bi losses occur either during the CVD process or during the high temperature anneal (ferroanneal) of the deposited SBT thin film. Bi losses during the CVD process are usually low at or below a deposition temperature of 430° C., e.g., 0.5% relative (i.e., the amount lost into the bottom electrode divided by the amount initially deposited). However, during the ferroanneal high Bi losses ranging from 5 to 50% relative are observed.

The ferroanneal of the as-deposited metal oxide ceramic layer on the substrate is conducted in pure oxygen or air at a temperature of about 550–830° C., preferably about 650–820° C., and a pressure of about 1 atmosphere. A second metal layer, e.g., of Pt, is then applied by conventional technique, e.g., plasma enhanced CVD (PECVD), onto the metal oxide ceramic layer, and the substrate is thereafter ferroannealed again to provide the desired capacitor product having the first applied Pt layer as the bottom electrode and the second applied layer as the top electrode, with the ferroelectric metal oxide ceramic layer (SBT) serving as dielectric between the two metal layers.

It is not surprising that Bi can migrate into the bottom electrode during the deposition process because all known Bi species are considered to be highly mobile and often very volatile at temperatures above 700° C.

This Bi loss is detrimental to the electrical properties of the metal oxide ceramic layer or film, such as the remanent polarization P$_r$ and the leakage current because they are highly dependent on the film composition. In addition, if the film depletes significantly in Bi content, other non-ferroelectric phases might be formed, e.g., a pyrochlore phase (which is Bi deficient), which would detrimentally "dilute" the desired ferroelectric phase.

The observed Bi loss into the bottom electrode appears to be a consequence of Bi$_2$O$_3$ segregation during the ferroanneal step. This segregation impairs the electrical properties in three ways. Firstly, the ferroelectric phase does not have the proper stoichiometry, and this lowers the remanent polarization P$_r$. Secondly, free Bi$_2$O$_3$ located on the grain boundaries is conductive and thereby increases the leakage currents. Thirdly, other phases may be formed.

The amount of segregation of Bi$_2$O$_3$ during the ferroanneal step and the amount of observed Bi loss appear to depend on the structure and properties of the as-deposited phase. For example, conventional liquid applied sol-gel films (spin-on liquid applied films) show a very low Bi loss during a subsequent ferroanneal step. It has been observed that the Bi loss of CVD provided films during the subsequent ferroanneal step depends on the conditions under which the as-deposited film is formed.

Figure 8:
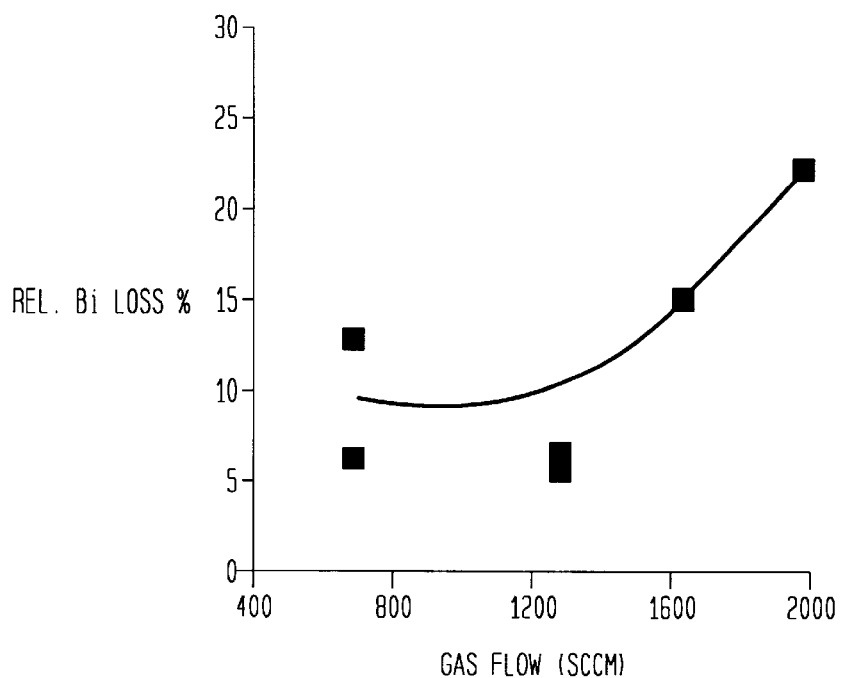
FIG. 8 is a graph showing relative bismuth loss as a function of total gas flow in a CVD reactor.

Referring now to FIG. 8, a graph is shown of the Bi loss as a function of the total gas flow in the CVD reactor chamber. It will be seen that the total gas flow during the CVD process has a significant influence on the Bi loss. Thus, as shown in FIG. 8, films deposited under the conditions of a decomposition temperature of 385° C., a vacuum pressure of 1 Torr, and an $O_2$/Ar carrier gas ratio of 50%, revealed a significantly higher Bi loss during the subsequent ferroanneal step when these films were deposited at 1,600 sccm total gas flow (22% relative loss) compared to films deposited at 800 sccm (5–7% relative loss). The solvent system used in these experiments was THF/iPrOH/tetraglyme.

Because a lower gas flow rate means a lower amount of oxygen is delivered per minute into the CVD reactor chamber, and because the delivered amount of precursor per minute is not affected by the total gas flow (the three basic flows being individually controlled by mass flow controllers, as shown in FIGS. 1–3), resorting to lower total gas flow rates causes the ratio of the oxidizer to the precursor and solvent vapors to change. Specifically, lowering the total gas flow lowers the $O_2$ :precursor/solvent vapors ratio. Therefore, it may be assumed that the ratio of the $O_2$ :precursor/solvent vapors is very important to control Bi migration.

While the matter is not completely understood at this time, it is believed that more of the highly volatile bismuth pentoxide ($Bi_2O_5$), as distinguished from bismuth trioxide ($Bi_2O_3$), is formed under oxygen-rich conditions. This is further supported by the fact that increasing the $O_2$ content from 50% to 88% increases the Bi loss from 22% to 35%. Bismuth pentoxide ($Bi_2O_5$) has a melting point of 150° C. and is therefore much more volatile than bismuth trioxide ($Bi_2O_3$), which has a melting point of 824° C.

Besides causing the formation of Bi oxides in oxidation states higher than +3, an excess of $O_2$ might also lead to the trapping of $O_2$ or O atoms in vacancies of the as-deposited phase.

Indeed, differences in the amount of $O_2$ present during the CVD process might have an adverse effect not only on the film stoichiometry but also on the structure and morphology of the as-deposited phase. For example, the number of vacancies, and the crystal size and shape may serve as functions of the $O_2$:precursor/solvent vapors ratio or of the $O_2$ partial pressure. Thus, under certain conditions an as-deposited phase might be formed which has a higher number of vacancies and which therefore will release more (or less) Bi during the ferroanneal step. Also, the total gas flow might change these properties of the as-deposited phase.

Too little oxygen, however, might leave Bi metal or Bi in low valent oxidation states. Upon ferroannealing, these low valent oxidation states would disproportionate into Bi metal and $Bi_2O_3$. The Bi metal, however, cannot form a tertiary oxide phase, i.e., the ferroelectric Aurivillius phase (strontium bismuth tantalate, SBT, $SrBi_2Ta_2O_9$), and would therefore be rejected and migrate into the bottom electrode (Bi metal having a melting point of 271° C.). The $O_2$:precursor/solvent vapors ratio might also have an influence on the oxidation state of the Ta ions. Ideally, the Ta ions should have the oxidation state +5. However, if there is not enough $O_2$ in the system, lower oxidation states might be preferred, such as +4 and +3.

Also, too little oxygen might lead to incorporation of carbon into the thin film. The presence of Bi metal, Ta in low oxidation states and carbon, however, adversely affect the structure and properties of the as-deposited phase.

Because the properties of the as-deposited phase affect the phase transformation during the ferroanneal step, they also influence the electrical properties of the final film. For this reason, it is very important to control carefully the process parameters during the CVD process, such as $O_2$ content and flow in the reactor chamber.

The amount of solvent vapors and the chemistry of these vapors significantly influence the oxygen content in the boundary layer (i.e., the part of the gas phase that is closest to the substrate surface) and on the substrate surface itself, the locations where the precursor decomposition takes place. As mentioned above, the oxygen content is important for controlling the oxidation state of the Bi and Ta precursors as well as for controlling oxygen atom (O) and carbon atom (C) impurities in the as-deposited film.

Thus, oxygen and oxidation state control of the as-deposited film is essential for achieving and maintaining the desired electrical properties of the ferroannealed film.

Vapors of volatile hydrocarbon type substances such as the contemplated protonating additive substances and/or activating agents, themselves are considered to consume oxygen from the gas phase and thereby change the amount of oxygen available for oxidation of the precursors to the desired metal oxide ceramic layer or film. These hydrocarbon type substances can therefore be used to control the oxygen content in the boundary layer and on the substrate surface. In particular, some of these hydrocarbon type substances may act as reducing agents, e.g., alcohols such as methanol, ethanol, n-propanol, isopropanol, etc., and thereby help to avoid or suppress formation of bismuth pentoxide ($Bi_2O_5$), which has an oxidation state of +5, or help to reduce in situ formed $Bi_2O_5$ to $Bi_2O_3$. Hence, such protonating additive substances and/or activating agents serve to control the oxidation state of the metals in the as-deposited films as well as the amount of entrapped oxygen in the as-deposited phase.

Although it might at first seem easier to control the oxygen in the reactor chamber by simply delivering less $O_2$ into the reactor chamber, this is not the same as using such protonating additive substances and/or activating agents for controlling the available oxygen, because the latter change the way the oxygen reacts with the precursors or with their decomposition intermediates. Such protonating additive substances and/or activating agents change the chemical milieu in which the decomposition of the precursors occurs. This will lead to different decomposition intermediates. In addition, the chemical potential of the gas phase is changed compared to that using pure $O_2$ and the standard solvent vapors from the precursor delivery system.

Indeed, the oxidizing gas can even be advantageously omitted where there is sufficient oxygen available at the thermal combustion site from another attendant source such as water:

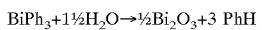

In particular, the contemplated volatile alcohols serve to reduce Bi oxides in higher oxidation states which are formed during the precursor decomposition.

The presence of such additive substances and/or activating agents also has an effect on the morphology, e.g., the crystal size, shape, etc., of the as-deposited film. This is because these substances change the decomposition pathways and thereby the intermediates. In addition, they can become adsorbed onto the substrate surface. Both the providing of different intermediates and the adsorption of the vapors of the additive substances and/or activating agents on the substrate surface have an influence on the growth, crystal structure and morphology of the as-deposited phase.

Besides volatile brominated and iodinated lower aliphatic or aromatic hydrocarbons, nitro compounds such as nitroalkanes, nitro benzene, p-nitro toluene, etc., are usable to influence the structure and properties of the as-deposited film, because they serve to modify the chemical decomposition reactions of the precursors.

Hence, the stated hydrocarbon type solvent vapors significantly influence the deposition rate. Crucial are the chemical nature of the hydrocarbon type solvent vapors and their amount in the gas phase. These enhance the deposition efficiency because they actively interact with the precursor before or during its decomposition immediately adjacent the hot substrate surface or on such hot surface. This may involve the formation of Bi intermediates which stick and decay more efficiently on the hot substrate surface.

Thus, for example, a special solvent system, e.g., a mixture of volatile alkanes, might be used for more efficient evaporation of the precursors. On the other hand, for deposition of the metal oxides, such a system might be disadvantageous, such that other hydrocarbon type solvent vapors would be more beneficial.

Nevertheless, these vapors (i.e., of the pertinent additive substance and/or activating agent) may now be added separately to the reaction gas, e.g., by way of the separate evaporation of a certain amount of a volatile alcohol and admixing these vapors with the precursor gas before it enters the CVD reactor chamber (as contemplated in the arrangement of FIG. 1), or by way of admixing these solvent vapors in the reactor chamber itself (as contemplated in the arrangement of FIG. 2), or by way of adding them to the oxidizer gas/inert gas mixture (as contemplated in the arrangement of FIG. 3).

Oxidation products of the provided solvent vapors can have the same effect as the solvent vapors themselves. Thus, volatile alkanes will form $H_2O$ in the proximity of the hot substrate surface. The $H_2O$ will, however, change the decomposition pathways of the precursors because it can act similarly to volatile lower alcohols by replacing a thd or a Ph ligand, as described above. This will lead to other more efficient decomposition pathways for the precursors. $H_2$, e.g., in the forming gas, will have the same effect.

Evidence shows that the chemical composition (e.g., oxygen content), crystallinity, orientation, density and structure of the as-deposited phase determines the electrical properties of the final SBT phase, such as leakage current, double remanent polarization ($2P_r$, i.e., two equally stable states of opposite polarization, $+P_r$ and $-P_r$) and fatigue. This is because these properties of the as-deposited phase determine how the phase transition into the ferroelectric Aurivillius phase occurs during the subsequent ferroannealing step.

Vapors of the additive substance and/or activating agent present in the decomposition area immediately adjacent to or on the hot substrate surface exert an influence on the amount of oxygen available for combustion of the precursors. They also may have reducing properties, especially in the case of the volatile lower alcohols, e.g., ethanol, n-propanol, isopropanol, and the like. Thus, they can control the oxidation state of the metals in the deposited oxides, and also have an influence on the amount of oxygen and other species, like carbon atoms (C), entrapped in the as-deposited phase.

Thus, such additive substances and/or activating agents can help to control the structure and properties of the as-deposited phase. These properties determine how the phase transformation occurs during the ferroanneal step, e.g., how much Bi is segregated, and which other second phases are formed. The way in which this phase transformation occurs significantly influences the electrical properties of the ferroannealed film.

EXAMPLE

A CVD process is carried out using iPrOH (isopropanol) as protonating additive substance, in a reactor chamber in accordance with the arrangement of FIG. 3.

The precursor organo metal compounds used are $Sr(thd)_2$(tetraglyme), $Bi(thd)_3$ and $Ta(OiPrOH)_4(thd)$. They are each dissolved in a solvent system mixture of octane/decane/PA in a solvent molar ratio of 5:4:1, respectively, and stored separately in three reservoirs. The molar concentrations are: Sr precursor 0.15 mole, Bi precursor 0.25 mole and Ta precursor 0.40 mole. Prior to delivery, the three precursor solutions are mixed in a liquid delivery system (LDS) to obtain the proper liquid composition.

The precursor mixture is delivered by a pump to a conventional vaporizer consisting of two chambers which are separated by a frit or finely porous divider. The vaporizer is maintained at a temperature of 190–200° C. As soon as the precursor solution contacts the hot surface of the frit, the solvent system and precursors are immediately evaporated by flash evaporation. Ar is used as carrier gas to transport the gaseous state precursor and solvent system flow into the reactor chamber distributor or shower head, where it is mixed with additional Ar and with $O_2$ as oxidizer. Then, the combined gaseous flows of precursor and solvent system, Ar carrier gas and $O_2$ oxidizer, enter the CVD reactor chamber and are directed to the hot substrate. The temperature of the substrate is maintained by a resistively heated chuck. After decomposing at the hot surface of the substrate, the residual gases are exhausted through a cold trap into a vacuum pump with a high flow capacity. Vacuum pressure is maintained in the system by a throttle valve and by adjustment of the total gas flow. All reactor walls as well as the distributor or shower head and connecting feed lines (including the vaporizer, shower head, chamber and cold trap) are heated to 200–220° C. per conventional cold wall reactor technique.

The substrate, e.g., a $Pt/Ti/SiO_2/Si$ wafer, is introduced into the chamber through a load-lock and placed on the hot chuck. It is allowed to heat up to the process temperature, after which the flow of $O_2$ is turned on to establish the $O_2/Ar$ ratio. Finally, the precursor and solvent system gaseous flow is allowed to enter the reactor chamber. At the end of the deposition process, the precursor and solvent system gas flow is turned off, the reactor chamber is flushed with the $O_2/Ar$ mixture and the wafer is removed from the reactor chamber through the load-lock.

The following data represent an example of the deposition parameters used:

Deposition temperature: 385° C.

Total gas pressure: 1 Torr.

Total gas flow: 1,600 sccm.

Oxygen content: 50%.

Substrate: 100 nm Pt/10 nm Ti/625 nm $SiO_2$/Si.

Coating time: 30 minutes.

The iPrOH is delivered from a bubbler as shown in FIG. 3. The iPrOH vapors are mixed with the precursor/carrier gas vapors either before the distributor or shower head or they are introduced into the reactor chamber separately from the precursor/carrier gas vapors.

The substrate having the metal oxide ceramic layer or film deposited thereon is then subjected to a ferroanneal step at a temperature of 650–820° C. in air at a pressure of 1 atmosphere, and then a second Pt layer is deposited by conventional technique on the metal oxide ceramic layer, followed by a second ferroanneal step under the same ferroannealing conditions.

Figure 9:
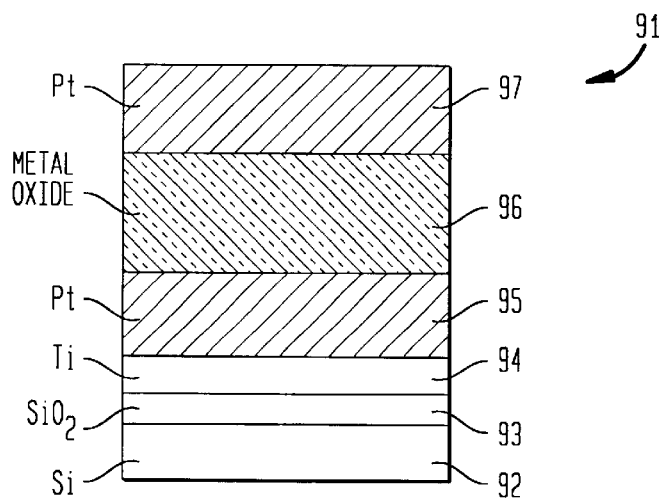
FIG. 9 is a side view showing a ferroelectric capacitor produced according to the invention.

Referring now to FIG. 9, there is shown a ferroelectric capacitor arrangement 91 comprising silicon substrate 92 having in succession a $SiO_2$ layer, a Ti metal layer, a first Pt metal layer serving as bottom electrode, a ferroelectric metal oxide ceramic layer 96 deposited according to the method of the invention as shown in the above example and serving as ferroelectric dielectric, and a second Pt metal layer 97 serving as top electrode, and which has been ferroannealed after deposition of the metal oxide ceramic layer 96 thereon, and again ferroannealed after deposition of the second Pt metal layer.

Comparable results are obtained upon repeating the above example using water, acetic acid, methyl acetate, acetaldehyde, dimethyl ketone and methyl amine, respectfully, in place of isopropanol, in a corresponding amount.

A similar CVD process run is effected using carbon monoxide, a lower alkane and hydrogen, respectively, in place of isopropanol. The carbon monoxide, lower alkane or hydrogen is delivered from a gas cylinder, rather than via a bubbler, as these are normally gaseous substances, whereas isopropanol is normally a liquid.

A similar CVD process run is effected using a hydrocarbon-based polymer as substrate and a milder thermal decomposition temperature of 300° C., under otherwise comparable conditions, for obtaining comparable results.

Accordingly, it can be appreciated that the specific embodiments described are merely illustrative of the general principles of the invention. Various modifications may be provided consistent with the principles set forth.

What is claimed is:

1. A method of forming a metal oxide ceramic layer on a substrate by chemical vapor deposition, comprising conducting a gaseous flow of a vaporized solution of a precursor organo metal compound in a volatile organic solvent, in the presence of a protonating additive substance in gaseous state selected from the group consisting of water, a volatile carboxylic acid compound, a volatile ketone, a volatile amine ammonia, and compatible mixtures thereof, into contact with a surface portion of the substrate under a vacuum pressure at a thermal decomposition temperature effective for converting the precursor compound to its corresponding metal oxide;

the additive substance being present in an amount sufficient for facilitating the thermal decomposition of the precursor compound and for controlling the in situ oxidation state of the deposited metal and the amount of oxygen in the formed layer.

2. The method of claim 1 wherein the carboxylic acid compound is selected from the group consisting of a volatile carboxylic acid, a volatile carboxylic acid anhydride, a volatile carboxylic acid ester, a volatile carboxylic acid nitrile, a volatile carboxylic acid isonitrile and a volatile carboxylic acid aldehyde.

3. The method of claim 1 wherein the additive substance is present in an amount of about 0.01–200 mols per mol of the precursor compound.

4. The method of claim 1 wherein the conducting of the gaseous flow is effected in the additional presence of an activating agent in gaseous state selected from the group consisting of carbon monoxide, hydrogen, a volatile lower aliphatic hydrocarbon having 1–4 carbon atoms, and aromatic hydro carbon, which volatile hydrocarbon is optionally substituted by a bromo, iodo or nitro substituent, in an amount sufficient for producing in situ hydrogen-active compounds for enhancing the converting of the corresponding precursor compound to its said metal oxide.

5. The method of claim 1 wherein the decomposition temperature is about 150–800° C. and the vacuum pressure is about 0.01–100 Torr.

6. The method of claim 1 wherein the substrate comprises silicon containing a surface layer of a metal, and the decomposition temperature is about 300–500° C. and the vacuum pressure is about 0.5–20 Torr.

7. The method of claim 1 wherein the substrate comprises a hydrocarbon based polymer containing a surface layer of a metal, and the decomposition temperature is about 150–350° C. and the vacuum pressure is about 0.5–20 Torr.

8. The method of claim 1 wherein the gaseous flow includes an oxidizing gas comprising an oxygen-containing inert carrier gas containing about 20–80% oxygen.

9. The method of claim 1 wherein the vaporized solution of the precursor compound and the additive substance are each provided in an inert carrier gas.

10. The method of claim 1 wherein the precursor compound comprises an organo bismuth compound.

11. The method of claim 1 wherein the precursor compound comprises a mixture of an organo bismuth compound, an organo strontium compound and an organo tantalum compound.

12. The method of claim 1 wherein the precursor compound comprises a triorgano bismuth compound.

13. The method of claim 1 wherein the precursor compound comprises a mixture of a triorgano bismuth compound, a diorgano strontium compound and a pentaorgano tantalum compound.

14. The method of claim 13 wherein the mixture is provided for forming a ferroelectric material comprising $SrBi_2Ta_2O_9$ from the metal oxide ceramic layer on the substrate, and the substrate on which the metal oxide ceramic layer is formed is thereafter ferroannealed at an annealing temperature of about 650–820° C. in oxygen or air at a pressure of about 1 atmosphere.

15. The method of claim 14 wherein the substrate comprises silicon containing a surface layer of a metal, and after the substrate is ferroannealed, another layer of said metal is provided on the metal oxide ceramic layer, and the substrate is thereafter again ferroannealed at said temperature and pressure in oxygen or air, to form a capacitor having two layers of said metal as the top and bottom electrodes separated by the metal oxide ceramic layer as a dielectric.

16. The method of claim 1 wherein the precursor compound comprises a mixture of bismuth tris-2,2,6,6-tetramethyl heptane-3,5-dionate or bismuth triphenyl, plus strontium bis-2,2,6,6-tetramethyl heptane-3,5-dionate and tantalum 2,2,6,6-tetramethyl heptane-3,5-dionate tetra isopropoxide.

17. The method of claim 16 wherein the strontium bis-2,2,6,6-tetramethyl heptane-3,5-dionate is provided in the form of the corresponding tetraglyme adduct or pentamethyl diethylene triamine adduct.

18. The method of claim 15 wherein the mixture is provided in a solvent system of tetrahydrofuran/isopropyl alcohol/tetraglyme or of octane/decane/pentamethyl diethylene triamine.

19. The method of claim 18 wherein the mixture is provided in a solvent system of tetrahydrofuran/isopropyl alcohol/tetraglyme in a molar ratio of 8:2:1 or of octane/decane/pentamethyl diethylene triamine in a molar ratio of 5:4:1.

20. The method of claim 16 wherein the mixture is provided in a solvent system of tetrahydrofuran/isopropyl alcohol/tetraglyme or of octane/decane/pentamethyl diethylene triamine.

21. The method of claim 20 wherein the mixture is provided in a solvent system of tetrahydrofuran/isopropyl alcohol/tetraglyme in a molar ratio of 8:2:1 or of octane/decane/pentamethyl diethylene triamine in a molar ratio of 5:4:1.

22. A method of forming a bismuth oxide ceramic layer on a substrate by chemical vapor deposition, comprising:

conducting a gaseous flow of an oxygen-containing inert carrier gas comprising about 40–80% oxygen and a vaporized solution of a precursor organo bismuth compound in a volatile organic solvent, in the presence of a protonating additive substance in gaseous state selected from the group consisting of water, a volatile carboxylic acid compound, a volatile ketone, a volatile amine, ammonia, and compatible mixtures thereof, into contact with a surface portion of the substrate under a vacuum pressure of about 0.1–100 Torr at a thermal decomposition temperature of about 150–800° C. for converting the precursor compound to its corresponding bismuth oxide;

the additive substance being present in an amount sufficient for facilitating the thermal decomposition of the precursor compound and for controlling the in situ oxidation state of the deposited metal and the amount of oxygen in the formed layer.

23. The method of claim 22 wherein the carboxylic acid compound is selected from the group consisting of a volatile carboxylic acid, a volatile carboxylic acid anhydride, a volatile carboxylic acid ester, a volatile carboxylic acid nitrile, a volatile carboxylic acid isonitrile and a volatile carboxylic acid aldehyde.

24. The method of claim 22 herein the additive substance is present in an amount of about 0.01–200 mols per mol of the precursor compound.

25. The method of claim 22 wherein the conducting of the gaseous flow is effected in the additional presence of an activating agent in gaseous state selected from the group consisting of carbon monoxide, hydrogen, a volatile lower aliphatic hydrocarbon having 1–4 carbon atoms and aromatic hydrocarbon, which volatile hydrocarbon is optionally substituted by a bromo, iodo or nitro substituent, in an amount sufficient for producing in situ hydrogen-active compounds for enhancing the converting of the corresponding precursor compound to its said metal oxide.

26. The method of claim 22 wherein the decomposition temperature is below 450° C.

27. A method of forming a bismuth oxide ceramic layer on a substrate by chemical vapor deposition, comprising:

conducting a gaseous flow of an oxygen-containing inert carrier gas comprising about 40–80% oxygen and a vaporized solution of a mixture of precursor organo metal compounds comprising a precursor triorgano bismuth compound, a precursor diorgano strontium compound and precursor pentaorgano tantalum compound in a volatile organic solvent, in the presence of a protonating additive substance in gaseous state selected from the group consisting of water, a volatile carboxylic acid compound, a volatile ketone, a volatile amine, ammonia, and compatible mixtures thereof, into contact with a surface portion of the substrate under a vacuum pressure of about 0.1–100 Torr at a thermal decomposition temperature of about 150–800° C. for converting the triorgano bismuth compound to bismuth trioxide, the diorgano strontium compound to strontium monoxide and the pentaorgano tantalum compound to tantalum pentoxide;

the additive substance being present in an amount sufficient for facilitating the thermal decomposition of the triorgano bismuth compound, the diorgano strontium compound and the pentaorgano tantalum compound and for controlling the in situ oxidation state of the corresponding deposited metal and the amount of oxygen in the formed layer, while suppressing the formation of volatile intermediates and of vacancies in the formed layer.

28. The method of claim 27 wherein the carboxylic acid compound is selected from the group consisting of a volatile carboxylic acid, a volatile carboxylic acid anhydride, a volatile carboxylic acid ester, a volatile carboxylic acid nitrile, a volatile carboxylic acid isonitrile and a volatile carboxylic acid aldehyde.

29. The method of claim 27 wherein the additive substance is present in an amount of about 0.01–200 mols per mol of the precursor compound.

30. The method of claim 27 wherein the conducting of the gaseous flow is effected in the additional presence of an activating agent in gaseous state selected from the group consisting of carbon monoxide, hydrogen, a volatile lower aliphatic hydrocarbon having 1–4 carbon atoms, and aromatic hydrocarbon, which volatile hydrocarbon is optionally substituted by a bromo, iodo or nitro substituent, in an amount sufficient for producing in situ hydrogen-active compounds for enhancing the converting of the corresponding precursor compound to its said metal oxide.

31. The method of claim 27 wherein the decomposition temperature is below 450° C.

32. A method of forming a bismuth oxide ceramic layer on a substrate by chemical vapor deposition, comprising:

conducting a gaseous flow of an oxygen-containing inert carrier gas comprising about 40–80% oxygen and a vaporized solution of a mixture of precursor organo metal compounds comprising bismuth tris-2,2,6,6-tetramethyl heptane-3,5-dionate or bismuth triphenyl, plus strontium bis-2,2,6,6-tetramethyl heptane-3,5-dionate and tantalum 2,2,6,6-tetramethyl heptane-3,5-dionate tetra isopropoxide in a volatile organic solvent comprising tetrahydrofuran/isopropyl alcohol/tetraglyme in a molar ratio of 8:2:1 or octane/decane/pentamethyl diethylene triamine in a molar ratio of 5:4:1, in the presence of a protonating additive substance in gaseous state selected from the group consisting of water, a volatile carboxylic acid compound, a volatile ketone, a volatile amine, ammonia, and compatible mixtures thereof, into contact with a surface portion of the substrate under a vacuum pressure of about 0.1–100 Torr at a thermal decomposition temperature of about 150–800° C. for converting the bismuth tris-2,2,6,6-tetramethyl heptane-3,5-dionate or bismuth triphenyl to bismuth trioxide, the strontium bis-2,2,6,6-tetramethyl heptane-3,5-dionate to strontium monoxide and the tantalum 2,2,6,6-tetramethyl heptane-3,5-dionate tetra isopropoxide to tantalum pentoxide;

the additive substance being present in an amount of about 0.01–200 mols per inol of each of the corresponding bismuth tris-2,2,6,6-tetramethyl heptane-3,5-dionate or bismuth triphenyl, strontium bis-2,2,6,6-tetramethyl heptane-3,5-dionate and tantalum 2,2,6,6-tetramethyl heptane-3,5-dionate tetra isopropoxide, for facilitating the thermal decomposition of the precursor organo compounds and for controlling the in situ oxidation state of the corresponding deposited metal and the amount of oxygen in the formed layer, while suppressing the formation of volatile intermediates and of vacancies in the formed layer.

33. The method of claim 32 wherein the carboxylic acid compound is selected from the group consisting of a volatile carboxylic acid, a volatile carboxylic acid anhydride, a volatile carboxylic acid ester, a volatile carboxylic acid nitrile, a volatile carboxylic acid isonitrile, and a volatile carboxylic acid aldehyde.

34. The method of claim 32 wherein the conducting of the gaseous flow is effected in the additional presence of an activating agent in gaseous state selected from the group consisting of carbon monoxide, hydrogen, a volatile lower aliphatic hydrocarbon having 1–4 carbon atoms, and aromatic hydrocarbon, which volatile hydrocarbon is optionally substituted by a bromo, iodo or nitro substituent, in an amount sufficient for producing in situ hydrogen-active compounds for enhancing the converting of the corresponding precursor compound to its said metal oxide.

35. The method of claim 34 wherein the decomposition temperature is below 450° C.

36. A method of forming a metal oxide ceramic layer on a substrate by chemical vapor deposition, comprising
conducting a gaseous flow of a vaporized solution of a precursor organo metal compound in a volatile organic solvent, in the presence of a protonating additive substance in gaseous state comprising a volatile lower alcohol having 1–4 carbon atoms, into contact with a surface portion of the substrate under a vacuum pressure at a thermal decomposition temperature below 450° C. for converting the precursor compound to its corresponding metal oxide;
the additive substance being present in an amount sufficient for facilitating the thermal decomposition of the precursor compound and for controlling the in situ oxidation state of the deposited metal and the amount of oxygen in the formed layer.

37. The method of claim 36 wherein the additive substance is present in an amount of about 25–200 mols per mol of the precursor compound.

38. The method of claim 36 wherein the conducting of the gaseous flow is effected in the additional presence of an activating agent in gaseous state selected from the group consisting of carbon monoxide, hydrogen, a volatile lower aliphatic hydrocarbon having 1–4 carbon atoms, and aromatic hydrocarbon, which volatile hydrocarbon is optionally substituted by a bromo, iodo or nitro substituent, in an amount sufficient for producing in situ hydrogen-active compounds for enhancing the converting of the corresponding precursor compound to its said metal oxide.

39. The method of claim 36 wherein the vacuum pressure is about 0.01–100 Torr.

40. The method of claim 36 wherein the substrate comprises silicon containing a surface layer of a metal, and the decomposition temperature is about 300–445° C. and the vacuum pressure is about 0.5–20 Torr.

41. The method of claim 36 wherein the substrate comprises a hydrocarbon based polymer containing a surface layer of a metal, and the decomposition temperature is about 150–350° C. and the vacuum pressure is about 0.5–20 Torr.

42. The method of claim 36 wherein the gaseous flow includes an oxidizing gas comprising an oxygen-containing inert carrier gas containing about 20–80% oxygen.

43. The method of claim 36 wherein the vaporized solution of the precursor compound and the additive substance are each provided in an inert carrier gas.

44. The method of claim 36 wherein the precursor compound comprises an organo bismuth compound.

45. The method of claim 36 wherein the precursor compound comprises a mixture of an organo bismuth compound, an organo strontium compound and an organo tantalum compound.

46. The method of claim 36 wherein the precursor compound comprises a triorgano bismuth compound.

47. The method of claim 36 wherein the precursor compound comprises a mixture of a triorgano bismuth compound, a diorgano strontium compound and a pentaorgano tantalum compound.

48. The method of claim 36 wherein the precursor compound comprises a mixture of bismuth tris-2,2,6,6-tetramethyl heptane-3,5-dionate or bismuth triphenyl, plus strontium bis-2,2,6,6-tetramethyl heptane-3,5-dionate and tantalum 2,2,6,6-tetramethyl heptane-3,5-dionate tetra isopropoxide.

49. The method of claim 48 wherein the strontium bis-2,2,6,6-tetramethyl heptane-3,5-dionate is provided in the form of the corresponding tetraglyme adduct or pentamethyl diethylene triamine adduct.

50. The method of claim 49 wherein the mixture is provided in a solvent system of tetrahydrofuran/isopropyl alcohol/tetraglyme or of octane/decane/pentamethyl diethylene triamine.

51. The method of claim 50 wherein the mixture is provided in a solvent system of tetrahydrofuran/isopropyl alcohol/tetraglyme in a molar ratio of 8:2:1 or of octane/decane/pentamethyl diethylene triamine in a molar ratio of 5:4:1.

52. The method of claim 48 wherein the mixture is provided in a solvent system of tetrahydrofuran/isopropyl alcohol/tetraglyme or of octane/decane/pentamethyl diethylene triamine.

53. The method of claim 52 wherein the mixture is provided in a solvent system of tetrahydrofuran/isopropyl alcohol/tetraglyme in a molar ratio of 8:2:1 or of octane/decane/pentamethyl diethylene triamine in a molar ratio of 5:4:1.

54. A method of forming a metal oxide ceramic layer on a substrate by chemical vapor deposition, comprising:
conducting a gaseous flow of a vaporized solution of a precursor organo metal compound in a volatile organic solvent, in the presence of an activating agent in gaseous state selected from the group consisting of carbon monoxide, hydrogen, a volatile lower aliphatic hydrocarbon having 1–4 carbon atoms, and aromatic hydrocarbon, which volatile hydrocarbon is optionally substituted by a bromo, iodo or nitro substituent, into contact with a surface portion of the substrate under a vacuum pressure at a thermal decomposition temperature effective for converting the precursor compound to its corresponding metal oxide;
the activating agent being present in an amount sufficient for producing in situ hydrogein-active compounds for enhancing the converting of the precursor compound to its said metal oxide and for controlling the in situ oxidation state of the deposited metal and the amount of oxygen in the formed layer.

55. The method of claim 54 wherein the decomposition temperature is about 150–800° C. and the vacuum pressure is about 0.01–100 Torr.

56. The method of claim 54 wherein the substrate comprises silicon containing a surface layer of a metal, and the decomposition temperature is about 300–500° C. and the vacuum pressure is about 0.5–20 Torr.

57. The method of claim 54 wherein the substrate comprises a hydrocarbon based polymer containing a surface layer of a metal, and the decomposition temperature is about 150–350° C. and the vacuum pressure is about 0.5–20 Torr.

58. The method of claim 54 wherein the precursor compound comprises a mixture of bismuth tris-2,2,6,6- tetramethyl heptane-3,5-dionate or bismuth triphenyl, plus strontium bis-2,2,6,6-tetramethyl heptane-3,5-dionate and tantalum 2,2,6,6-tetramethyl heptane-3,5-dionate tetra isopropoxide.

59. The method of claim 58 wherein the strontium bis-2, 2,6,6-tetramethyl heptane-3,5-dionate is provided in the form of the corresponding tetraglyme adduct or pentamethyl diethylene triamine adduct.

60. The method of claim 59 wherein the mixture is provided in a solvent system of tetrahydrofuran/isopropyl alcohol/tetraglyme or of octane/decane/pentamethyl diethylene triamine.

61. The method of claim 60 wherein the mixture is provided in a solvent system of tetrahydrofuran/isopropyl alcohol/tetraglyme in a molar ratio of 8:2:1 or of octane/decane/pentamethyl diethylene triamine in a molar ratio of 5:4:1.

62. The method of claim 58 wherein the mixture is provided in a solvent system of tetrahydrofuran/isopropyl alcohol/tetraglyme or of octane/decane/pentamethyl diethylene triamine.

63. The method of claim 62 wherein the mixture is provided in a solvent system of tetrahydrofuran/isopropyl alcohol/tetraglyme in a molar ratio of 8:2:1 or of octane/decane/pentamethyl diethylene triamine in a molar ratio of 5:4:1.

64. The method of claim 54 wherein the decomposition temperature is below 450° C.

* * * * *